(12) United States Patent
Park et al.

(10) Patent No.: US 11,868,042 B2
(45) Date of Patent: Jan. 9, 2024

(54) MASTER STAMP FOR NANO IMPRINT AND METHOD FOR MANUFACTURING THE SAME

(71) Applicant: Samsung Display Co., Ltd., Yongin-Si (KR)

(72) Inventors: Seung-won Park, Seoul (KR); Yunjong Yeo, Asan-si (KR); Sanghoon Lee, Cheonan-si (KR); Daehwan Jang, Seoul (KR); Incheol Jeong, Suwon-si (KR); Hyungbin Cho, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 239 days.

(21) Appl. No.: 16/504,806

(22) Filed: Jul. 8, 2019

(65) Prior Publication Data

US 2020/0073235 A1 Mar. 5, 2020

(30) Foreign Application Priority Data

Aug. 31, 2018 (KR) .................. 10-2018-0103601

(51) Int. Cl.
*G03F 7/00* (2006.01)
*B82Y 40/00* (2011.01)
(Continued)

(52) U.S. Cl.
CPC ......... *G03F 7/0002* (2013.01); *G02B 5/3058* (2013.01); *G02F 1/133528* (2013.01);
(Continued)

(58) Field of Classification Search
CPC ........ G03F 7/0002; G03F 7/0005; G03F 1/60; G02B 5/3058; B82Y 10/00; B82Y 40/00;
(Continued)

(56) References Cited

U.S. PATENT DOCUMENTS 4,902,366 A * 2/1990 Bader ................. B31F 1/07
156/181
7,070,406 B2 * 7/2006 Jeans ................ B29C 39/148
425/327
(Continued)

FOREIGN PATENT DOCUMENTS

CN 107402498 A 11/2017
EP 3246754 A1 11/2017
(Continued)

OTHER PUBLICATIONS

"Nanoimprint Lithography: Methods and Material Requirement", By L. Jay Guo, Willy InterScience, Discovery Something Great, 2007 Wiley-VCH Verlag GmbH & Co. KGaA, Weinheim, Advanced Materials 2007, 19, 495-513, 19 pages.

*Primary Examiner* — Seyed Masoud Malekzadeh
(74) *Attorney, Agent, or Firm* — Innovation Counsel LLP

(57) ABSTRACT

A stamp for nano imprinting includes a base substrate, a first pattern part and a second pattern part disposed on the base substrate and having different widths, and a third pattern part and a fourth pattern part having different widths. Each of the first pattern part to the fourth pattern part includes a plurality of nano patterns, and the first pattern part and the second pattern part and the third pattern part and the fourth pattern are disposed to be arranged adjacent to each other in a sequential order in the first direction.

16 Claims, 20 Drawing Sheets

(51) Int. Cl.
  *B29C 59/02* (2006.01)
  *G02B 5/30* (2006.01)
  *G02F 1/1335* (2006.01)
  *B82Y 10/00* (2011.01)

(52) U.S. Cl.
  CPC ...... *B29C 59/022* (2013.01); *B29C 2059/023* (2013.01); *B82Y 10/00* (2013.01); *B82Y 40/00* (2013.01)

(58) Field of Classification Search
  CPC ............ B29C 59/002; B29C 59/007; B29C 2059/022; B29C 59/022; B29C 2059/023
  USPC ........................................................ 425/385
  See application file for complete search history.

(56) References Cited

U.S. PATENT DOCUMENTS

| | | | | |
|---|---|---|---|---|
| 7,077,992 | B2* | 7/2006 | Sreenivasan | G03F 7/0002 264/293 |
| 7,309,225 | B2* | 12/2007 | McMackin | B82Y 40/00 264/1.36 |
| 7,708,543 | B2* | 5/2010 | Shirotori | G11B 5/743 264/293 |
| 7,780,893 | B2* | 8/2010 | Sreenivasan | G03F 9/7084 264/293 |
| 7,935,292 | B2* | 5/2011 | Sreenivasan | B82Y 40/00 264/293 |
| 8,361,336 | B2* | 1/2013 | Okushima | G03F 7/0002 425/176 |
| 8,557,130 | B2* | 10/2013 | Cho | B82Y 10/00 216/48 |
| 8,703,406 | B2 | 4/2014 | Schaper | |
| 8,703,618 | B2* | 4/2014 | Goto | G03F 7/0002 257/E21.214 |
| 9,452,574 | B2 | 9/2016 | Resnick et al. | |
| 9,868,634 | B2* | 1/2018 | Lee | G03F 7/0002 |
| 10,139,726 | B2* | 11/2018 | Park | G02F 1/00 |
| 2004/0021254 | A1* | 2/2004 | Sreenivasan | B82Y 10/00 264/447 |
| 2004/0022888 | A1* | 2/2004 | Sreenivasan | B82Y 40/00 425/810 |
| 2004/0219246 | A1* | 11/2004 | Jeans | B82Y 10/00 425/363 |
| 2007/0070548 | A1* | 3/2007 | Shirotori | G11B 5/855 |
| 2007/0141191 | A1* | 6/2007 | Kruijt-Stegeman | B29C 59/02 425/385 |
| 2008/0118697 | A1* | 5/2008 | Takahashi | G11B 7/261 264/293 |
| 2008/0272516 | A1* | 11/2008 | Liu | G03F 7/0002 977/887 |
| 2008/0299467 | A1* | 12/2008 | Kim | G03F 7/0002 427/372.2 |
| 2009/0224436 | A1* | 9/2009 | Mikami | G03F 7/0002 264/447 |
| 2010/0072653 | A1* | 3/2010 | Kawakami | B29C 43/14 264/134 |
| 2010/0233377 | A1* | 9/2010 | Aoki | B29C 59/022 427/355 |
| 2010/0264560 | A1* | 10/2010 | Zhang | B82Y 40/00 264/220 |
| 2011/0129956 | A1* | 6/2011 | Polito | H01L 31/0236 257/E31.13 |
| 2011/0309548 | A1* | 12/2011 | Aihara | B82Y 40/00 264/293 |
| 2012/0154919 | A1* | 6/2012 | Hu | G02B 5/003 216/2 |
| 2012/0200005 | A1* | 8/2012 | Sato | B29C 59/022 264/293 |
| 2012/0244244 | A1* | 9/2012 | Subramanian | B82Y 10/00 977/700 |
| 2013/0147096 | A1* | 6/2013 | Yang | G03F 7/0002 264/496 |
| 2013/0153534 | A1* | 6/2013 | Resnick | B29D 11/0074 216/24 |
| 2016/0033818 | A1* | 2/2016 | Lee | G02F 1/13336 359/485.05 |
| 2016/0288373 | A1 | 10/2016 | Kim et al. | |
| 2018/0021985 | A1 | 1/2018 | Jang et al. | |
| 2018/0088265 | A1* | 3/2018 | Kim | G02F 1/133512 |
| 2018/0101058 | A1* | 4/2018 | Kim | G02F 1/133536 |
| 2019/0033710 | A1* | 1/2019 | Shinoda | B29C 43/58 |
| 2019/0146334 | A1* | 5/2019 | Nishimura | G03F 7/0002 264/293 |
| 2020/0073235 | A1* | 3/2020 | Park | G02F 1/133528 |
| 2020/0257194 | A1* | 8/2020 | Sorin | G01N 21/41 |

FOREIGN PATENT DOCUMENTS

| | | |
|---|---|---|
| KR | 10-1155200 A | 6/2012 |
| KR | 10-1541814 A | 8/2015 |
| KR | 10-2016-0119896 A | 10/2016 |
| KR | 10-2017-0131766 A | 11/2017 |
| KR | 10-2018-0009825 A | 1/2018 |

* cited by examiner

MASTER STAMP FOR NANO IMPRINT AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2018-0103601, filed on Aug. 31, 2018, the disclosure of which is hereby incorporated by reference in its entirety.

BACKGROUND

The present disclosure relates to a stamp used for nano imprinting and a method for manufacturing the same, and more particularly, to a master stamp used for nano imprinting that can be manufactured to reduce a manufacturing cost and a method for manufacturing the same.

In general, nano imprinting refers to a technique for forming nano-scale fine patterns onto a layer. For example, a nano imprinting process includes a process to imprint a fine pattern onto a thin film in a process of manufacturing a device such as a display panel or a semiconductor chip. In the nano imprint process, a stamp having a nano pattern is pressed onto the thin film to pattern the thin film according to the nano pattern of the stamp. The nano imprinting process simplifies a patterning process of the thin film and improves productivity while reducing a manufacturing cost.

The nano pattern may be imprinted on a layer of a device having a large area by repeatedly performing the same patterning process using the same stamp. Thus, the capability to reuse the stamp and the durability of the stamp can significantly save the cost and time for manufacturing a device, particularly when the device has a large area such as a large display panel.

SUMMARY

The present disclosure provides a stamp for imprinting nano patterns on a layer of a device in a manufacturing process of the device. The present disclosure also provides a stamp for nano imprinting that can reduce a manufacturing cost.

The present disclosure also provides a method for manufacturing a stamp for nano imprinting.

An embodiment of the inventive concept provides a stamp for nano imprinting includes: a base substrate having a plane defined by a first direction and a second direction crossing each other; a first pattern group including a first pattern part and a second pattern part disposed on the base substrate, arranged to be spaced apart from each other in the first direction, and having different widths in the first direction; and a second pattern group including a third pattern part and a fourth pattern part disposed on the base substrate, arranged to be spaced apart from each other in the first direction, and having different widths in the first direction, wherein each of the first pattern part to the fourth pattern part includes a plurality of nano patterns, and wherein the first pattern part, the third pattern part, the second pattern part, and the fourth pattern part are disposed to be arranged adjacent to each other in a sequential order in the first direction.

In an embodiment, the second pattern part may have a second width that is smaller than a first width of the first pattern part.

In an embodiment, the third pattern part may have the first width of the first pattern part, and the fourth pattern part may have the second width of the second pattern part.

In an embodiment, the third pattern part may have a third width that is smaller than the first width of the first pattern part and greater than the second width of the second pattern part, and the fourth pattern part may have a fourth width that is smaller than the second width of the second pattern part.

In an embodiment, the first pattern group may further include a fifth pattern part and the second pattern group may further include a sixth pattern part, wherein the fifth pattern part and the sixth pattern part may be arranged to be adjacent to each other on the base substrate and disposed to be spaced apart from the first pattern part to the fourth pattern part in the first direction, a fifth width of the fifth pattern part in the first direction may be smaller than the second width of the second pattern part in the first direction, and a sixth width of the sixth pattern part has the fifth width of the fifth pattern part.

In an embodiment, the fifth pattern part may be spaced apart from the second pattern part with the fourth pattern part disposed therebetween, and the fifth pattern part and the sixth pattern part may be arranged to be adjacent to each other in the sequential order in the first direction.

In an embodiment, a difference between the second width of the second pattern part and the fifth width of the fifth pattern part may be same as a difference between the first width of the first pattern part and the second width of the second pattern part.

In an embodiment, the fifth pattern part and the sixth pattern part may be disposed between the third pattern part and the second pattern part.

In an embodiment, the stamp may further include a plurality of dummy patterns respectively disposed between the first pattern part to the fourth pattern part, wherein each of the plurality of dummy patterns may have a width that is greater than a width of a nano pattern of the plurality of nano patterns in the first direction.

In an embodiment, a difference in width of the first pattern and the second pattern may be about 400 μm or more.

In an embodiment of the inventive concept, a stamp for nano imprinting includes: a base substrate having a plane defined in a first direction and a second direction crossing each other; and a pattern group including a plurality of nano patterns disposed on the base substrate and spaced apart from each other in the first direction, wherein the pattern group includes a first pattern group and a second pattern group, each of first pattern group and the second pattern group includes a first pattern part and a second pattern part that are arranged to be spaced apart from each other in the first direction and have different widths, and the first pattern part of the first pattern group, the first pattern part of the second pattern group, the second pattern part of the first pattern group, and the second pattern part of the second pattern group are disposed to be arranged adjacent to each other in a sequential order in the first direction.

In an embodiment, each of the first pattern part and the second pattern part of the first pattern group and the first pattern part and the second pattern part of the second pattern group may have a width defined in the first direction, and a first width of the first pattern part of the first pattern group may be greater than a second width of the second pattern part of the first pattern group.

In an embodiment, the first pattern part of the second pattern group may have the first width of the first pattern part of the first pattern group, and the second pattern part of the second pattern group may have the second width of the second pattern part of the first pattern group.

In an embodiment, the first pattern part and the second pattern part of the first pattern group and the first pattern part and the second pattern part of the second pattern group may have widths that gradually decrease in the sequential order in the first direction.

In an embodiment, the stamp may further include a dummy pattern disposed between the first pattern group and the second pattern group and between the first pattern part and the second pattern part in each of the first pattern group and the second pattern group, wherein the dummy pattern may have a width that is greater than a width of a nano pattern of the plurality of nano patterns in the first direction.

In an embodiment of the inventive concept, a method for manufacturing a master stamp for nano imprinting includes: providing a base substrate including an active area and a peripheral area adjacent to the active area; providing a raw pattern layer in the active area of the base substrate; transferring a plurality of nano patterns of a first mold stamp to the raw pattern layer to form a first pattern part on a first area of the active area; and transferring the plurality of nano patterns of the first mold stamp to the raw pattern layer to form a second pattern part on a second area of the active area that is spaced apart from the first area, wherein the second pattern part has a second width that is smaller than a first width of the first pattern part.

In an embodiment, the method may further include transferring the plurality of nano patterns of a second mold stamp to the raw pattern layer to form a third pattern part on a third area that is provided between the first area and the second area, of the active area, wherein the third pattern part may have the first width of the first pattern part.

In an embodiment, the method may further include transferring the plurality of nano patterns of the second mold stamp to the raw pattern layer to form a fourth pattern part on a fourth area that is spaced apart from the third area with the second area disposed therebetween, wherein the fourth pattern part may have the second width of the second pattern part.

In an embodiment, the method may further include providing a plurality of dummy patterns respectively formed between different pattern parts, wherein a dummy pattern of a plurality of dummy patterns may have a width that is smaller than a width of a nano pattern of the plurality of nano patterns transferred to the active area.

In an embodiment, the forming of the first pattern part may include: forming a mask layer on the raw pattern layer; forming a photoresist pattern exposing an area of the mask layer that overlaps the first area on a plane; etching the mask layer exposed by the photoresist layer by using the photoresist pattern as a first mask; applying a resin layer to cover the first area; transferring the plurality of nano patterns of the first mold stamp to form a preliminary resin pattern including the plurality of nano patterns on the resin layer; and etching the raw pattern layer by using the preliminary resin pattern as a second mask.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
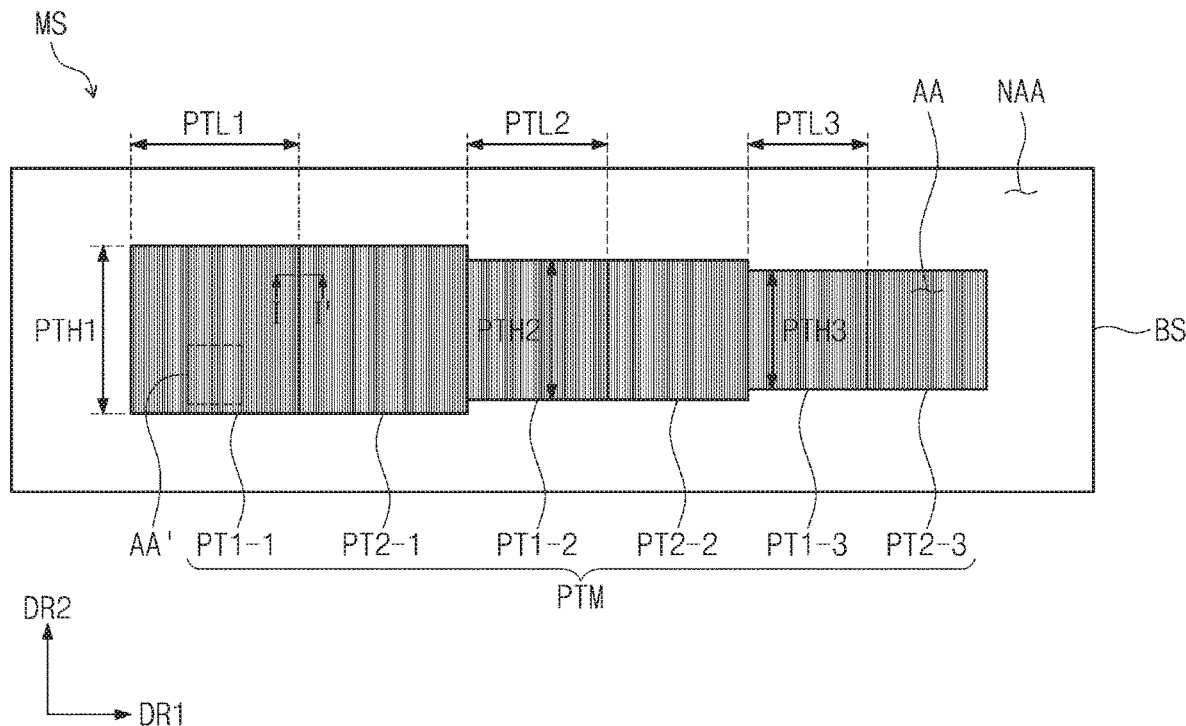
FIG. 1A is a plan view of a master stamp for nano imprinting according to an embodiment of the inventive concept.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims. Throughout the disclosure, like reference numerals refer to like elements throughout this disclosure. In the drawings, a portion of the components is exaggerated or minimized in scale to clearly express various layers and areas.

It will be apparent to those skilled in the art that various modifications and variations can be made in the inventive concept. Thus, it is intended that the present disclosure covers the modifications and variations of the present disclosure provided they come within the scope of the appended claims and their equivalents.

It will be understood that when an element such as a layer, region or substrate is referred to as being "on" another element, it can be directly on the other element or one or more intervening elements may be present. In contrast, the term "directly" means that there may be no intervening elements between the recited two elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" may mean "and/or." It will be further understood that the terms "comprises" and/or "comprising," or "includes" and/or "including" when used in this specification, specify a presence of stated features, regions, integers, steps, operations, elements, and/or components, but do not preclude a presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary spatially relative term "below" can encompass both an orientation of above and below. The device may be otherwise oriented (rotated 90 degrees or at other orientations), and the spatially relative terms used herein may be interpreted accordingly.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings herein.

"About" or "approximately" as used herein is inclusive of the stated value and means within an acceptable range of deviation for a particular value or a range of particular values as determined by one of ordinary skill in the art, considering measurement and an error associated with the measurement of the particular quantity (i.e., limitations of a measurement system). FIG. 1A is a plan view of a master stamp for nano imprinting according to an embodiment of the inventive concept. FIG. 2B is an enlarged view of an area AA' of FIG. 1A. FIGS. 2A to 2D are schematic views illustrating a method for manufacturing a display panel according to an embodiment of the inventive concept. Hereinafter, a master stamp for nano imprinting and an example of using the master stamp in a nano imprinting process according to an embodiment will be described with reference to FIGS. 1A and 2D.

Referring to FIG. 1A, a mater stamp MS for nano imprinting may be divided into an active area AA and a peripheral area NAA adjacent to the active area AA. The master stamp MS for nano imprinting includes a base substrate BS and a pattern group PTM. The active area AA and the peripheral area NAA may be provided on the base substrate BS. The active area AA may correspond to an area on which the pattern group PTM is disposed.

The base substrate BS may be a base layer supporting the pattern group PTM. Although the base substrate BS according to an embodiment has a rectangular shape defined by a direction DR1 and a second direction DR2, the embodiment of the inventive concept is not limited thereto. For example, the base substrate BS may have a polygonal shape or a circular shape.

The pattern group PTM includes a first pattern group PT1-1, PT1-2, and PT1-3 and a second pattern group PT2-1, PT2-2, and PT2-3.

The first pattern group PT1-1, PT1-2, and PT1-3 includes a first pattern part PT1-1 (hereinafter, referred to a first pattern part), a second pattern part PT1-2 (hereinafter, referred to a second pattern part), and a third pattern part PT1-3 (hereinafter, referred to as a third pattern part). The first pattern part PT1-1, the second pattern part PT1-2, and the third pattern part PT1-3 may be disposed to be spaced apart from each other in the first direction DR1.

The first pattern part PT1-1 has a first length PTL1 in the first direction DR1. The second pattern part PT1-2 has a second length PTL2 in the first direction DR1. The third pattern part PT1-3 has a third length PTL3 in the first direction DR1. According to an embodiment, the first length PTL1 is greater than the second length PTL2. The second length PTL2 is greater than the third length PTL3. Thus, the first length PTL1 is greater than the third length PTL3.

According to an embodiment, a difference between the first length PTL1 and the second length PTL2 may be the same as a difference between the second length PTL2 and the third length PTL3. For example, the difference between the first length PTL1 and the second length PTL2 and the difference between the second length PTL2 and the third length PTL3 may have the same value, i.e., about 400 μm or more.

The first pattern part PT1-1, the second pattern part PT1-2, and the third pattern part PT1-3 may have a first width PTH1, a second width PTH2, and a third width PTH3 in the second direction DR2, respectively.

According to an embodiment, the first width PTH1 is greater than the second width PTH2. The second width PTH2 is greater than the third width PTH3. Thus, the first width PTH1 is greater than the third width PTH3.

According to an embodiment, a difference between the first width PTH1 and the second width PTH2 may be the same as a difference between the second width PTH2 and the third width PTH3. For example, the difference between the first width PTH1 and the second width PTH2 and the difference between the second width PTH2 and the third width PTH3 may have the same value, i.e., about 400 μm or more.

The second pattern group PT2-1, PT2-2, and PT2-3 includes a first pattern part PT2-1 (hereinafter, also referred to a fourth pattern part), a second pattern part PT2-2 (hereinafter, also referred to a fifth pattern part), and a third pattern part PT2-3 (hereinafter, also referred to as a sixth pattern part).

According to an embodiment, the fourth pattern part PT2-1, the fifth pattern part PT2-2, and the sixth pattern part PT2-3 may be disposed to be spaced apart from each other in the first direction DR1. For example, the fourth pattern part PT2-1 is disposed between the first pattern part PT1-1 and the second pattern part PT1-2. The fifth pattern part PT2-2 is disposed between the second pattern part PT1-2 and the third pattern part PT1-3. The sixth pattern part PT2-3 is disposed to be spaced apart from the fifth pattern part PT2-2 with the third pattern part PT1-3 interposed therebetween. Relationships between lengths in the first direction DR1 and between widths in the second direction DR2 between the fourth pattern part PT2-1, the fifth pattern part PT2-2, and the sixth pattern part PT2-3 may be applied in the same manner as the relationships between the lengths and between the widths between the first pattern part PT1-1, the second pattern part PT1-2, and the third pattern part PT1-3. Thus, the length in the first direction DR1 and the width in the second direction DR2 of the fourth pattern part PT2-1 may be the same as the first length PTL1 and the first width PTH1 of the first pattern part PT1-1, respectively.

Similarly, the lengths and the widths of the second pattern part PT1-2 and the fifth pattern part PT2-2 may be the same, and the lengths and the widths of the third pattern part PT1-3 and the sixth pattern part PT2-3 may be the same.

Thus, the pattern group PTM of the master stamp MS for nano imprinting according to the inventive concept may have the plurality of pattern parts having an area that uniformly decreases in the first direction DR1.

Figure 1B:
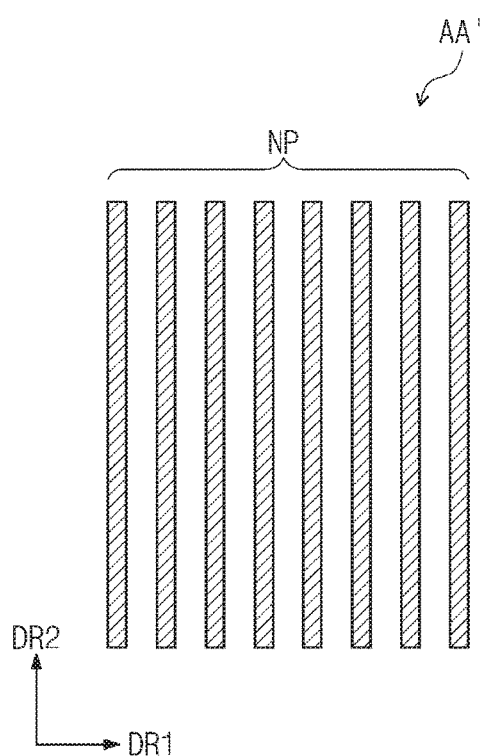
FIG. 1B is an enlarged view of an area AA' within the first pattern part PT1-1.

FIG. 1B is an enlarged view of an area AA' within the first pattern part PT1-1. Referring to FIG. 1B, the patterns of the pattern group PTM include nano patterns NP.

The plurality of nano patterns NP (hereinafter, also referred to as nano patterns NP) are disposed to spaced apart from each other in the first direction DR1. Each of the nano patterns NP extends in the second direction DR2. According to one embodiment, the nano patterns NP may include protrusion patterns that are disposed at constant intervals and have the same shape. The nano patterns NP may have a pitch having a nano size. For example, the pitch between adjacent nano patterns NP may range of about 90 nm to about 100 nm.

Figure 2A:
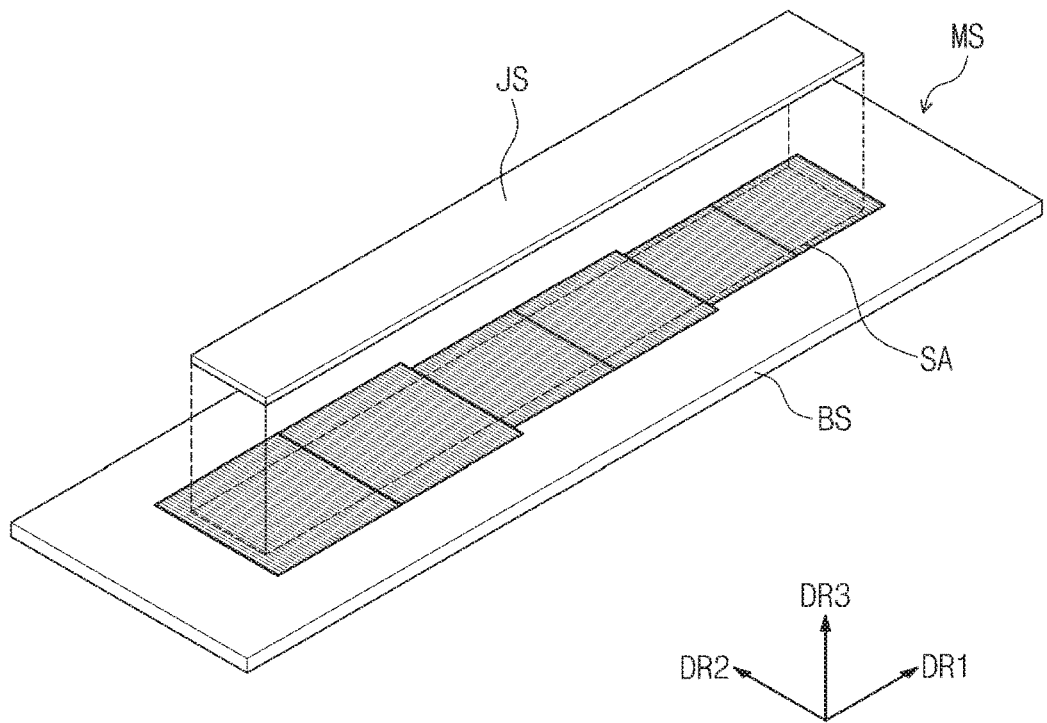
FIGS. 2A to 2D are schematic views illustrating a method for manufacturing a display panel according to an embodiment of the inventive concept.
Figure 2B:
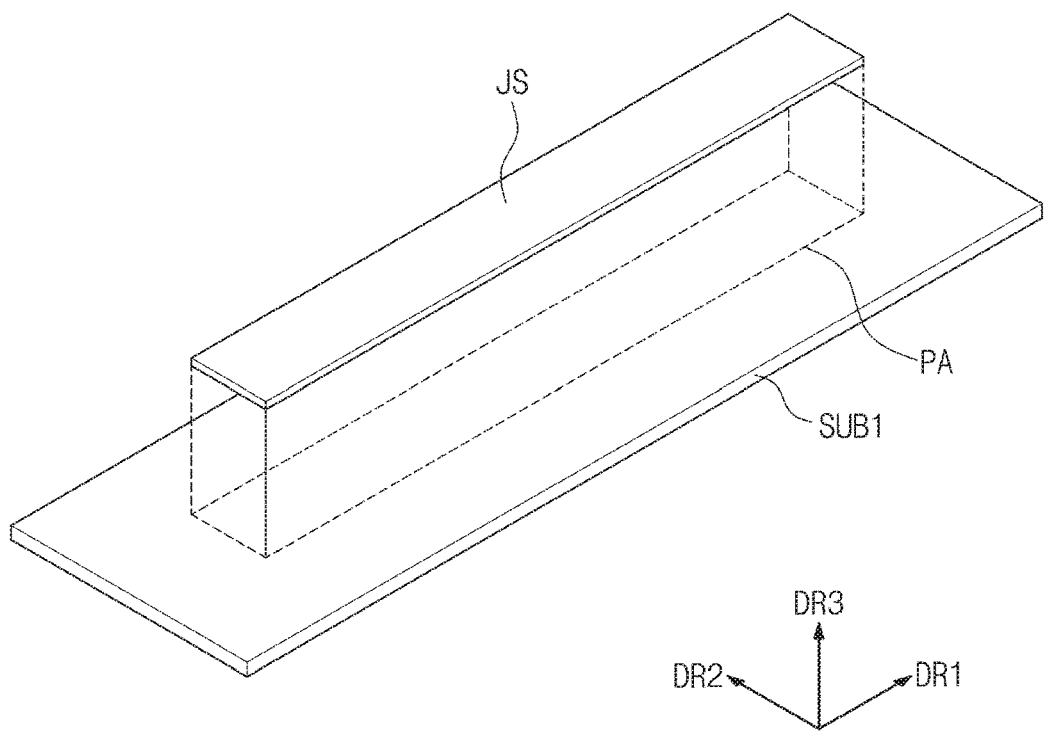

Referring to FIG. 2A, a nano imprinting process may be performed by using the master stamp MS for nano imprinting according to the inventive concept. The nano patterns NP of the master stamp MS may be transferred to a target film JS through the nano imprinting process by using the master stamp MS for nano imprinting as a master mold.

A transfer area SA may correspond to an area on which the nano patterns NP are substantially transferred to the target film JS and then patterned. The transfer area SA may be smaller than an area of the pattern group PTM. Thus, even though the width of the pattern group PTM in the second direction DR2 is varied in the first direction, the difference in the width between the pattern parts included in the pattern group PTM may not have an influence on the target film JS as long as the transfer area SA has a uniform area.

The target film JS on which the nano patterns NP of the master stamp MS for nano imprinting are transferred may have the same pattern as the nano patterns NP of the master stamp MS.

In FIG. 2B, for example, a preliminary transfer area PA on which the nano patterns NP of the master stamp MS are transferred to the target film JS is expressed by a dotted line on a first substrate SUB1. The transferring of the nano patterns NP may be performed through the nano imprinting process. The preliminary transfer area PA on which the nano patterns NP are formed may substantially correspond to the transfer area SA of the master stamp MS for nano imprinting.

Figure 2C:
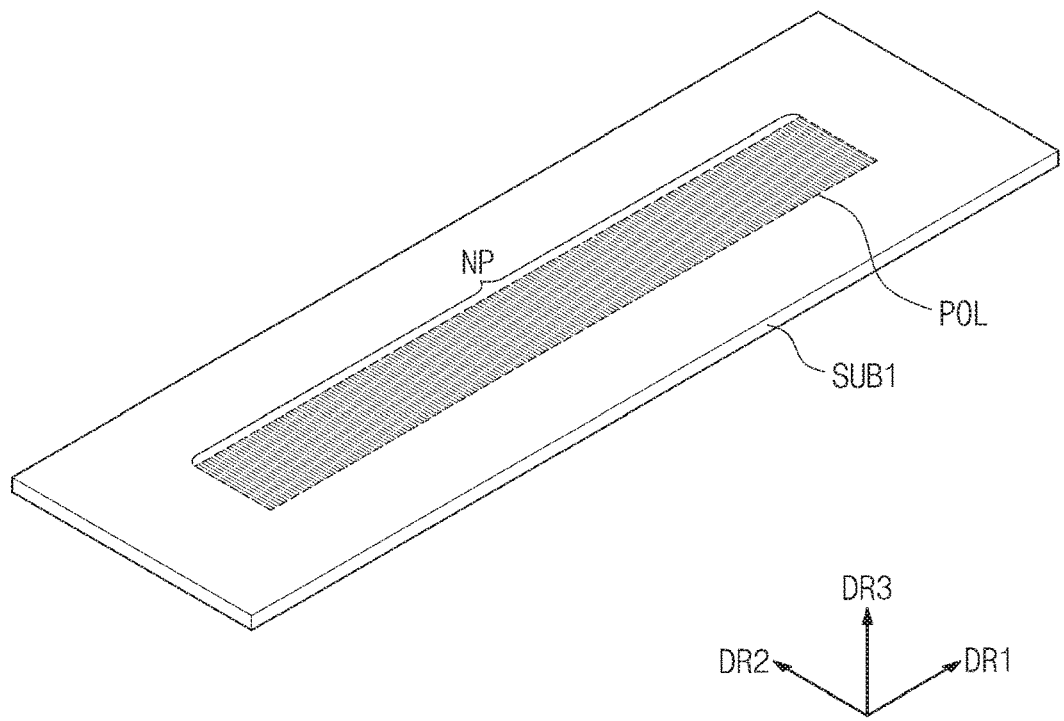
Figure 2D:
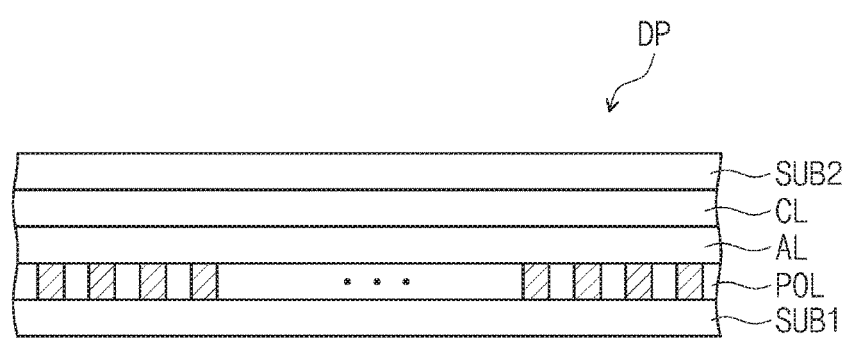
Figure 2D:
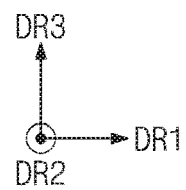

Referring to FIGS. 2C and 2D, a polarizer POL may be disposed on the first substrate SUB1 and imprinted with the nano patterns NP through the nano imprinting process described with reference to FIGS. 2A and 2B. The polarizer POL has substantially the same nano patterns NP of the pattern group PTM of the master stamp MS for nano imprinting.

Figure 3A:
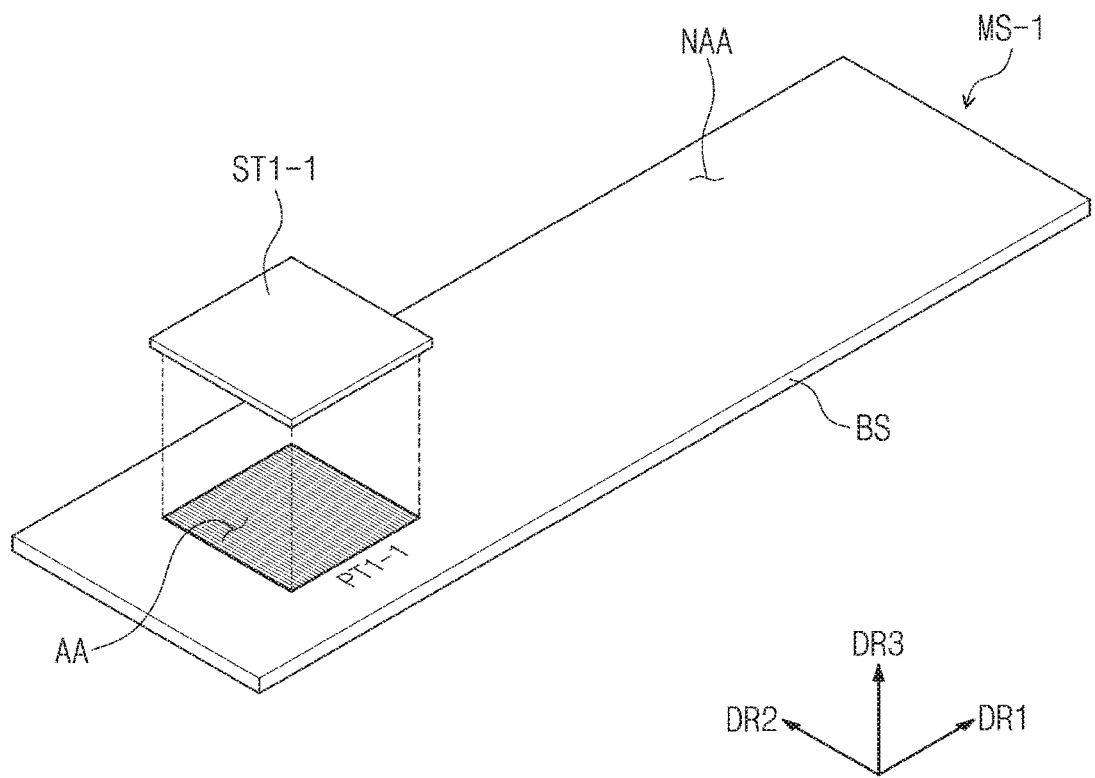
FIG. 3A is a perspective view of a master stamp for nano imprinting according to an embodiment of the inventive concept.

Although FIG. 2C illustrates that the polarizer POL may be formed by performing a single nano pattern transfer process, in the case of the polarizer POL having a large area, the active area AA of the master stamp MS may be smaller than the area of the polarizer, and the nano patterns NP corresponding to the active area AA may be transferred several times to form the entire nano patterns NP of the polarizer POL repeatedly using the same mold stamp (e.g., a first mold stamp ST1-1 shown in FIG. 3A). However, the present disclosure is not limited to a specific embodiment.

FIG. 2D is a schematic view of the display panel DP including the polarizer POL. Referring to FIG. 2D, the display panel DP may include a first substrate SUB1, the polarizer POL, an array layer AL, a liquid crystal layer CL, and a second substrate SUB2.

The first substrate SUB1 may be a transparent insulation substrate. The first substrate SUB1 may be a glass substrate or a transparent plastic substrate. For example, the first substrate SUB1 may include a glass substrate, a quartz substrate, a resin substrate, or the like. Although not shown, a buffer layer including an inorganic material may be disposed on the first substrate SUB1.

The polarizer POL may be disposed between the first substrate SUB1 and the second substrate SUB2. Nano patterns NP of the polarizer POL may be formed by nano patterning an inorganic layer. In this case, the target film JS shown in FIGS. 2A and 2B may be an organic film. After nano patterning, the polarizer POL includes the nano patterns NP for polarizing light incident from the liquid crystal layer CL.

The array layer AL may be disposed on the polarizer POL. However, the embodiment of the inventive concept is not limited thereto. For example, the polarizer POL may be disposed on the array layer AL. The array layer AL may include a plurality of thin film transistors and signal lines to drive the display panel DP. For example, the array layer AL may include a gate line, a data line crossing the gate line, a thin film transistor electrically connected to the gate line and the data line, a pixel electrode electrically connected to the thin film transistor, and a plurality of insulation layers.

The second substrate SUB2 is disposed to face the first substrate SUB1. The second substrate SUB2 may include a color filter. However, the embodiment of the inventive concept is not limited thereto. For example, the color filter may be disposed between the liquid crystal layer CL and the second substrate SUB2. The second substrate SUB2 may be a transparent insulation substrate. For example, the second substrate SUB2 may be a glass substrate or a transparent plastic substrate.

The liquid crystal layer CL is disposed between the first substrate SUB1 and the second substrate SUB 2. The liquid crystal layer CL may include liquid crystal molecules having optical anisotropy. The liquid crystal molecules may be directionally oriented by electric fields to transmit or block light passing through the liquid crystal layer CL, thereby displaying an image.

Figure 3B:
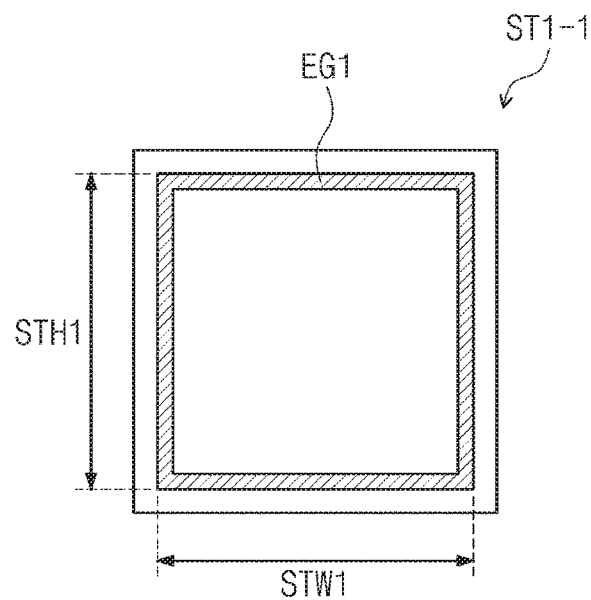
FIG. 3B is a plan view of a mold stamp according to an embodiment of the inventive concept.
Figure 3C:
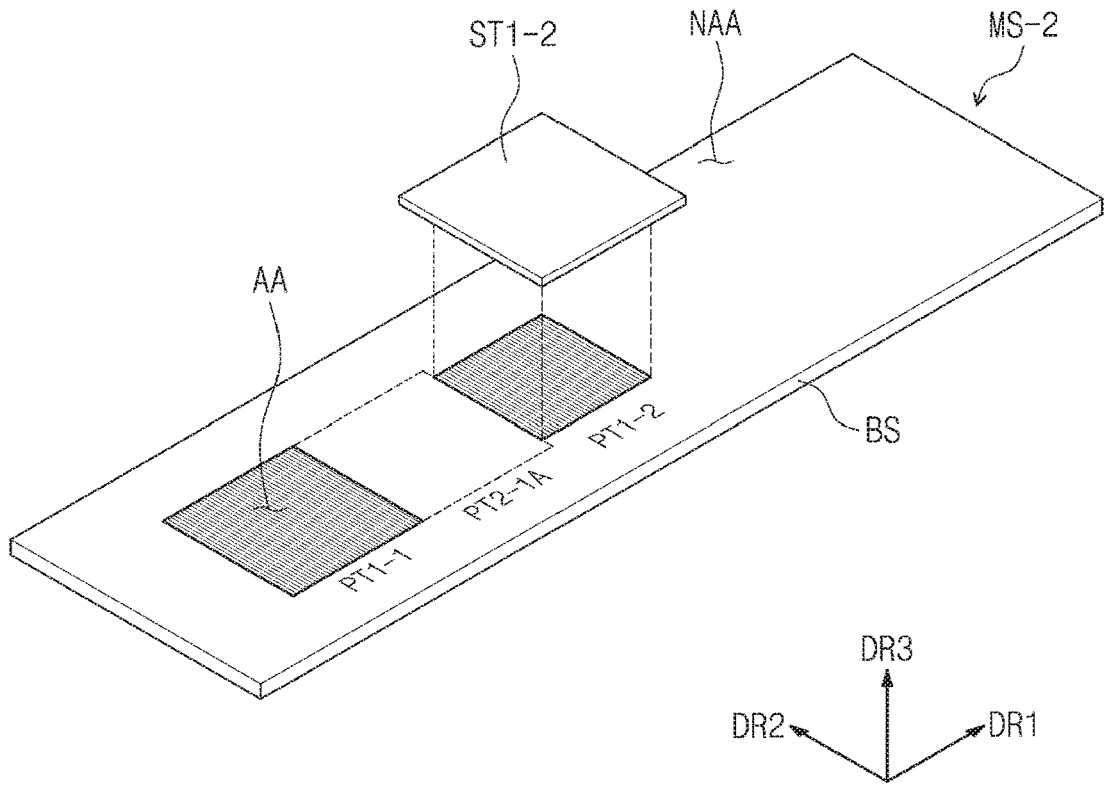
FIG. 3C is a perspective view of a master stamp for nano imprinting according to an embodiment of the inventive concept.
Figure 3D:
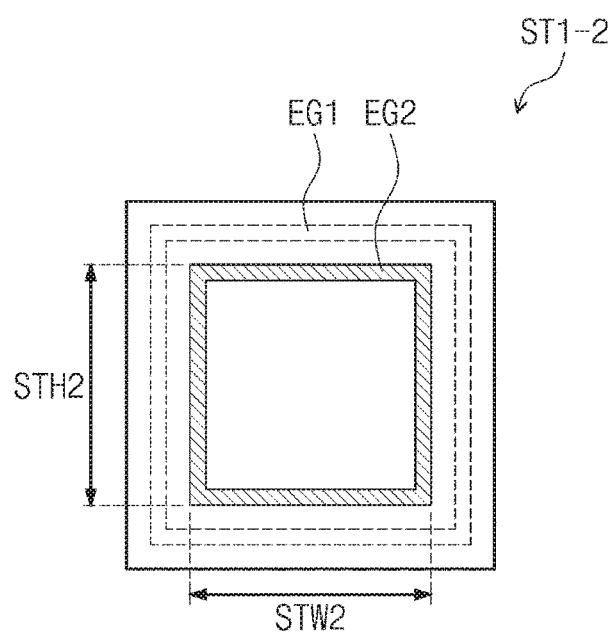
FIG. 3D is a plan view of a mold stamp according to an embodiment of the inventive concept.

FIG. 3A is a perspective view of a master stamp for nano imprinting according to an embodiment of the inventive concept. FIG. 3B is a plan view of a mold stamp according to an embodiment of the inventive concept. FIG. 3C is a perspective view of a master stamp for nano imprinting according to an embodiment of the inventive concept. FIG. 3D is a plan view of a mold stamp according to an embodiment of the inventive concept. FIGS. 4A to 4H are cross-sectional views illustrating a method for manufacturing a master stamp for nano imprinting according to an embodiment of the inventive concept. FIG. 4I is a plan view of a master stamp for nano imprinting according to an embodiment of the inventive concept.

The same reference numerals are used for the same components as those shown in FIGS. 1A to 2D, and duplicated descriptions will be omitted. Hereinafter, a mold stamp for manufacturing the master stamp for nano imprinting will be described with reference to FIGS. 3A to 3D, and a method for manufacturing the master stamp for nano imprinting will be described with reference to FIGS. 4A to 4I.

Referring to FIGS. 3A and 3B, a first pattern part PT1-1 may be formed on an active area AA of the base substrate BS through a nano imprinting process by using a first mold stamp ST1-1. A plurality of layers (not shown) may be disposed on the base substrate BS to perform the nano imprinting process. In a process of transferring nano patterns of the first mold stamp ST1-1 onto the base substrate BS to form the first pattern part PT1-1, a portion of the nano patterns of the first mold stamp ST1-1 may be damaged due to a stepped portion (e.g., a stepped portion DC shown in FIG. 4E) between a nano pattern transferring area and an area that is in the vicinity of the nano pattern transferring area. FIG. 3B shows the first mold stamp ST1-1 including a first edge area EG1 in which damaged patterns may exist. The first edge area EG1 may have a length STW1 and a width STH1.

Thus, when the first mold stamp ST1-1 having the first edge area EG1 is reused, the damaged patterns within the first edge area EG1 may be transferred as in a damaged pattern shape. Thus, uniform patterns may not be transferred, and reliability of the product may be deteriorated.

According to an embodiment, after the first pattern part PT1-1 is formed by transferring the nano patterns of the first mold stamp ST1-1, the first mold stamp ST1-1 may be reused to further transfer the nano patterns onto the base substrate BS. For the ease of description, the first mold stamp ST1-1 that is reused is referred as a mold stamp ST1-2 in FIG. 3C although the mold stamps ST1-1 and ST1-2 indeed refer to the same mold stamp. The mold stamp ST1-2 may include damaged patterns in the first edge area EG1 shown in FIG. 3B prior to being pressed onto the master stamp MS-2. FIG. 3C shows that an area of the second pattern part PT1-2 on which the nano patterns of the mold stamp ST1-2 is transferred is smaller than the area of the first pattern part PT-1. The nano pattern transferring process may continue reusing the same mold stamp in a similar manner with a predetermined interval therebetween.

FIG. 3D shows a second edge area EG2 of the mold stamp ST1-2 having a length STW2 and a width STH2 on which further damaged patterns exist after the nano patterning is done onto the master stamp MS-2. According to an embodiment, the first edge area EG1 may be placed on the outer edge of the mold stamp ST1-2 and may be greater than the second edge area EG2. Referring to FIGS. 3B and 3D, the length STW2 and the width STH2 of the second edge area EG2 are smaller than the length STW1 and the width STH1 of the first edge area EG1.

As described above, in the process of transferring the nano patterns in stages to manufacture a master stamp (e.g., master stamps MS-1 and MS-2 shown in FIGS. 3A and 3C) for the nano imprint, the same mold stamp (e.g., ST1-1 and ST1-2) may be used. Thus, the mold stamp may be reused while reducing the area to be transferred. Thus, the manufacturing cost of master stamp and the manufacturing time of the master stamp for nano imprinting may be reduced.

Hereinafter, a method for manufacturing the master stamp for nano imprinting will be described with reference to FIGS. 4A to 4H.

Figure 4A:
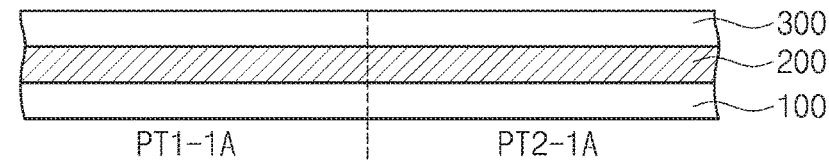
FIGS. 4A to 4H are cross-sectional views illustrating a method for manufacturing a master stamp for nano imprinting according to an embodiment of the inventive concept.
Figure 4A:
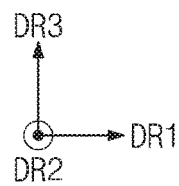

Referring to FIG. 4A, a substrate 100 may include glass. Although not shown, a flexible transparent resin layer may be formed on the substrate 100. For example, polyimide or polyamide may be applied and then cured to form a resin layer. The substrate 100 includes a first area PA1-1A and a second area PT2-1A. The substrate 100 according to the inventive concept may correspond to the base substrate BS of FIG. 1A.

A raw pattern layer 200 may be formed on the substrate 100. The raw pattern layer 200 may include a transparent inorganic insulation material. For example, the raw pattern layer 200 may include silicon oxide (SiOx), silicon nitride (SiNx), silicon oxynitride (SiON), or the like.

A first mask layer 300 may be formed on the raw pattern layer 200. The first mask layer 300 may include a metal. For example, the first mask layer 300 may include aluminum (Al), molybdenum (Mo), or the like.

Figure 4B:
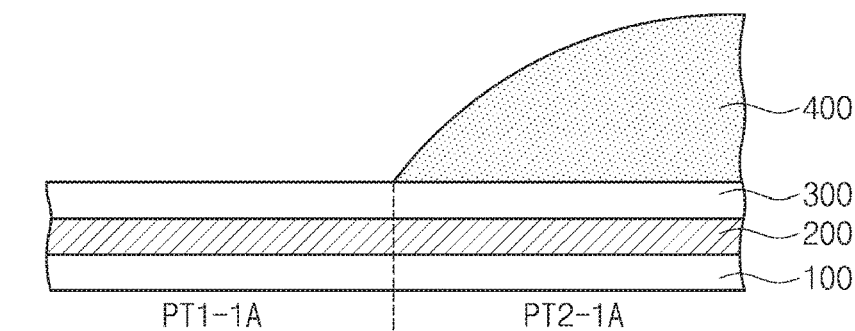
Figure 4B:
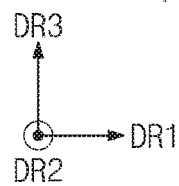
Figure 4C:
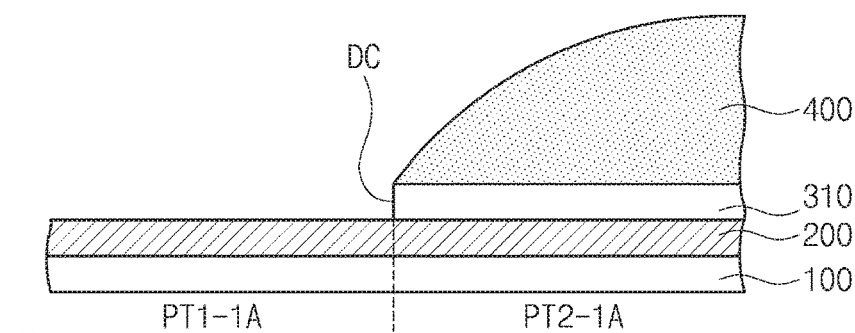
Figure 4C:
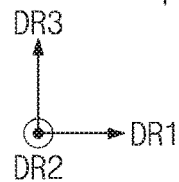

Thereafter, referring to FIGS. 4B and 4C, the first mask layer 300 may be patterned to form a first mask pattern 310 corresponding to the second area PT2-1A. A photoresist pattern 400 may be applied to an area overlapping the second area PT2-1A on a plane. The photoresist pattern 400 may be used as a mask layer for etching the first mask layer 300. The first mask layer 300 may be patterned by using the photoresist pattern 400 to form a first mask pattern 310.

After etching the first mask layer 300 using the photoresist pattern 400, a portion of the raw pattern layer 200 that overlaps the first area PT1-1A may be exposed, and a portion of the raw pattern layer 200 that overlaps the second area PT2-1A may be covered by the first mask pattern 310.

Figure 4D:
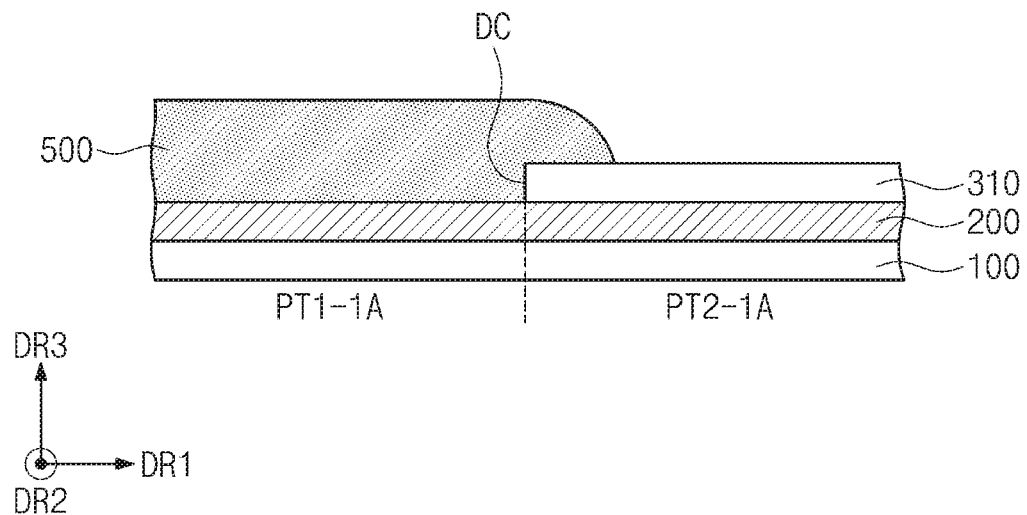

Thereafter, referring to FIG. 4D, the photoresist pattern 400 is removed, and a first resin layer 500 is applied to the substrate 100. The first resin layer 500 may cover an entire surface of the first area PT1-1A and cover a portion of the second area PT2-1A adjacent to the first area PT1-1A.

Figure 4E:
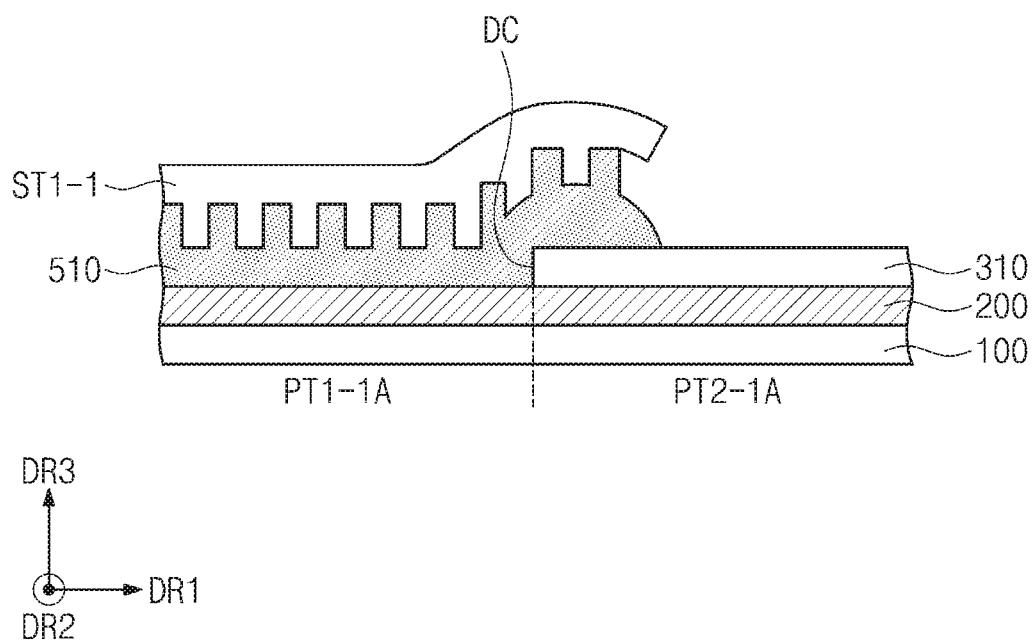
Figure 4F:
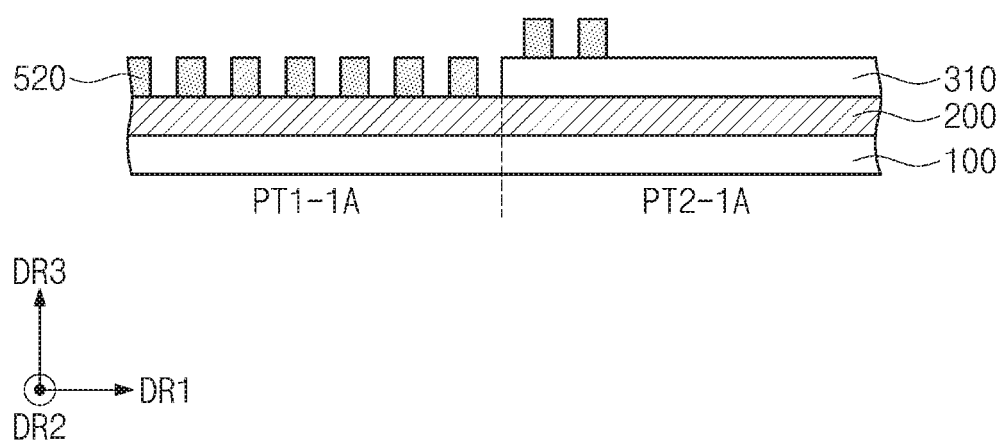

Thereafter, referring to FIGS. 4E and 4F, the first resin layer 500 of FIG. 4D may be pressed by the first mold stamp ST1-1 and then cured to form a preliminary resin pattern 510. In the example of the display panel DP shown in FIG. 2D, the first mold stamp ST1-1 may be used to form the polarizer POL and include protruding patterns that are spaced a predetermined distance from each other and have the same shape. The protrusion patterns may have a pitch of about 90 nm to about 100 nm. Thereafter, a residual layer may be removed from the preliminary resin pattern 510 to form a first resin pattern 520. After the preliminary resin pattern 510 is formed, an additional process (e.g., etching) may be performed thereon to physical remove a top portion of the preliminary resin pattern 510 to transform the preliminary resin pattern 510 to the first resin pattern 520. (the second way of removing the "residual layer.")

The first mask pattern 310 and the raw pattern layer 200 are disposed on layers different from each other. Thus, the preliminary resin pattern 510 may be formed to have a stepped portion DC on a boundary between the first mask pattern 310 and the raw pattern layer 200.

Figure 4G:
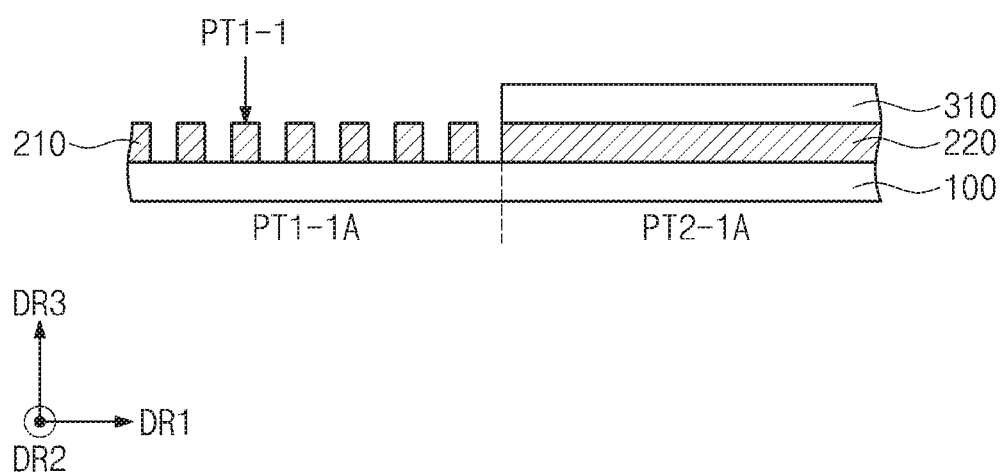
Figure 4H:
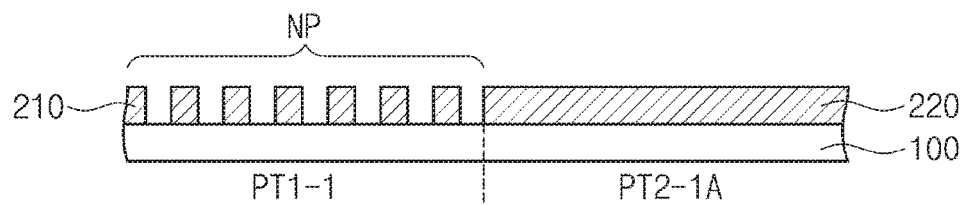
Figure 4H:
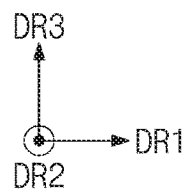
Figure 4I:
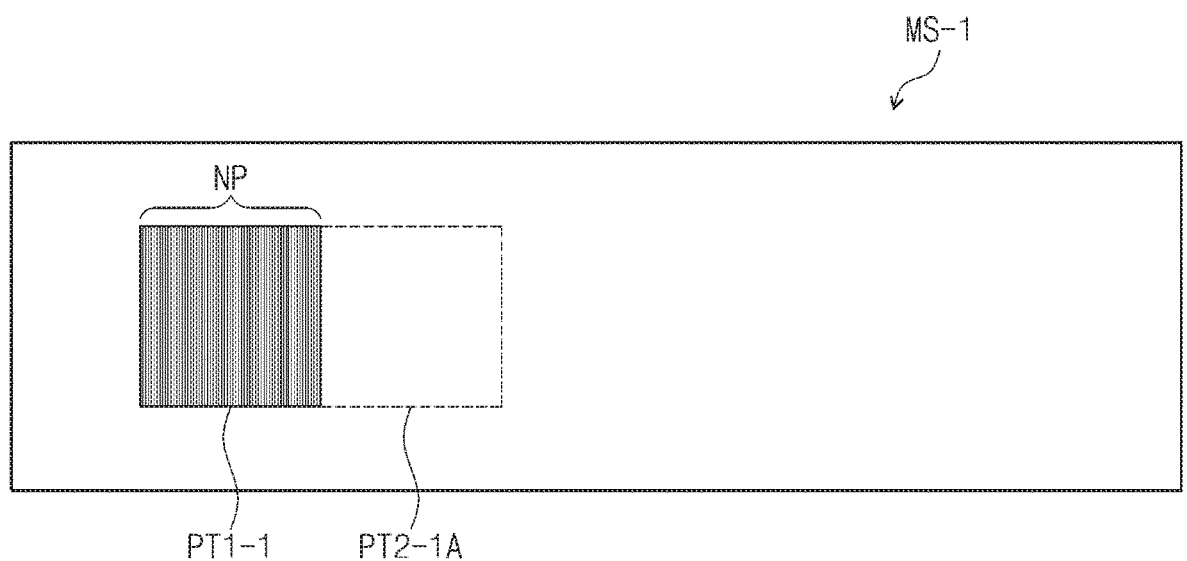
FIG. 4I is a plan view of a master stamp for nano imprinting according to an embodiment of the inventive concept.
Figure 4I:
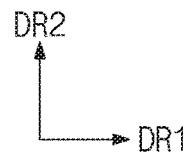

Thereafter, referring to FIGS. 4G and 4H, the raw pattern layer 200 is patterned to form a nano pattern 210. The raw pattern layer 200 in the first area PT1-1A is patterned by using the first resin pattern 520 and the first mask pattern 310. For example, the raw pattern layer 200 may be patterned by using the first resin pattern 520 and the first mask pattern 310 as etching barriers. Thus, the first pattern part PT1-1 having the nano pattern 210 may be formed in the first area PT1-1A as shown in FIG. 4G. Thereafter, the first mask pattern 310 remaining in the second area PT2-1A may be reduced.

Referring to FIG. 4H, the first pattern part PT1-1 including the plurality of nano patterns NP may be formed in the first area PT1-1A. For convenience of the description, the process of forming the first pattern part PT1-1 according to the process of FIGS. 4A to 4H may be referred to as a process of forming a first nano imprint pattern on the master stamp MS shown in FIGS. 1A and 2A.

FIG. 4I illustrates the master stamp MS-1 shown in FIG. 3A including the first pattern part PT1-1 formed in the first area PT1-1A that is adjacent to the second area PT2-1A. The first pattern part PT1-1 is formed through the manufacturing process described with reference to FIGS. 4A-4H. The first pattern part PT1-1 may corresponds to the first pattern part PT1-1 of FIG. 1A.

Figure 5A:
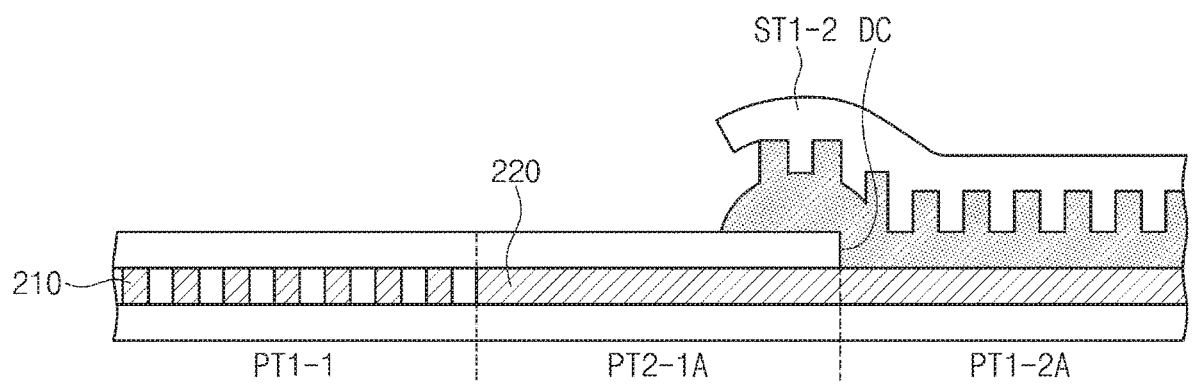
FIGS. 5A to 5C are cross-sectional views illustrating a method of manufacturing the master stamp for nano imprinting according to an embodiment of the inventive concept.
Figure 5A:
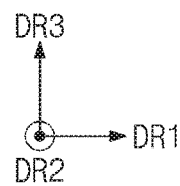
Figure 5B:
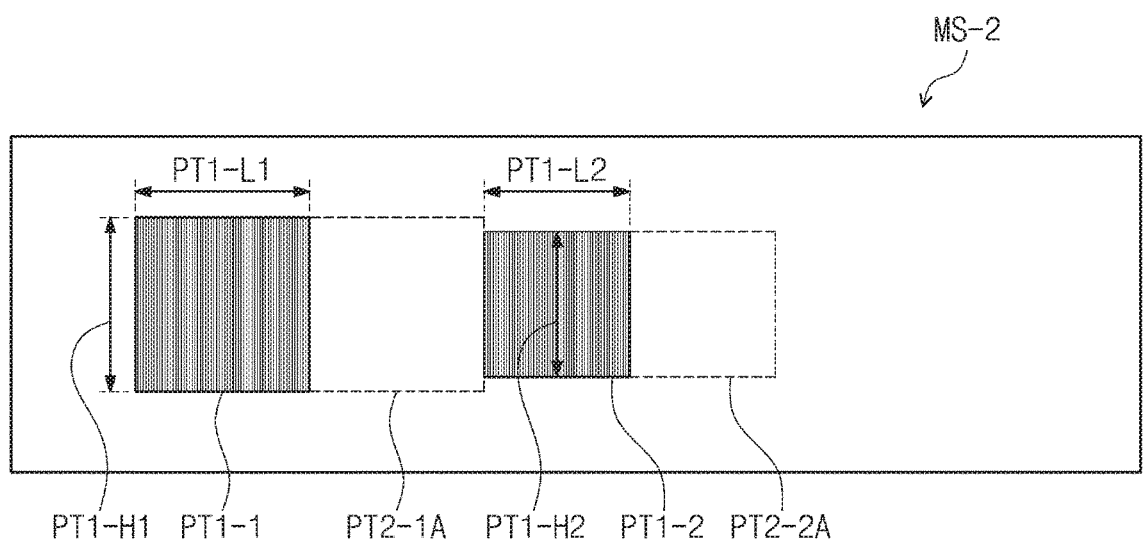
Figure 5B:
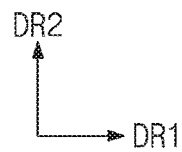
Figure 5C:
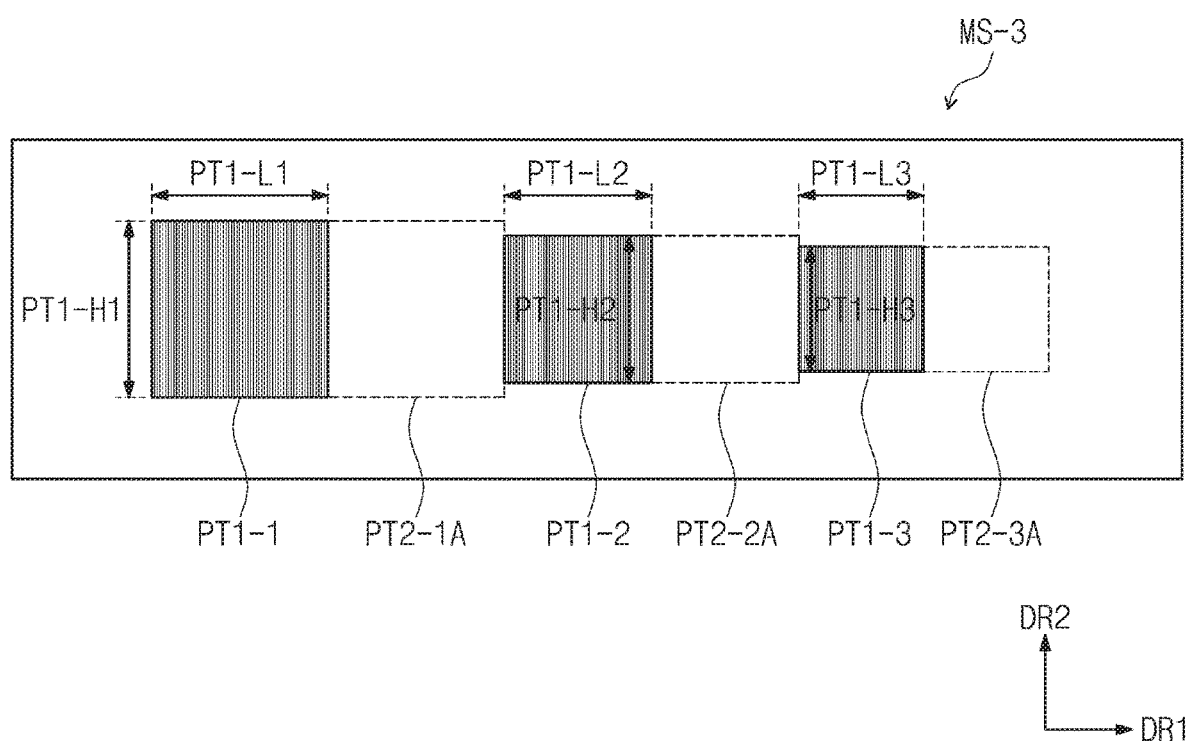

FIGS. 5A to 5C are cross-sectional views illustrating a method of manufacturing the master stamp for nano imprinting according to an embodiment of the inventive concept;

FIG. 5A illustrates a process of forming the second pattern part PT1-2 of the first pattern group PT1-1, PT1-2, and PT1-3 in the second area PT2-1A as described with reference to FIG. 1A. FIG. 5A illustrates a process corresponding to the process illustrated in FIG. 4E. The process of forming the second pattern part PT1-2 may be performed through the same process as that described with reference to FIGS. 4A to 4H. For convenience of the description, the process of forming the second pattern part PT1-2 may be referred to as a process of forming a second nano imprint pattern on the master stamp MS shown in FIGS. 1A and 2A.

The second pattern part PT1-2 has a length and a width that are smaller than those of the first pattern part PT1-1, as illustrated in FIGS. 3A to 3D, and the second pattern part PT1-2 may be transferred by using the mold stamp ST1-2 that is the same mold stamp ST1-1 that is used when the first pattern part PT1-1 is transferred. FIG. 5B illustrates the master stamp MS-2 shown in FIG. 3C including the second pattern part PT1-2 corresponding to the second pattern part PT1-2 of FIG. 1A is formed. The second pattern part PT1-2 may be spaced apart from the first pattern part PT1-1 by a predetermined distance, for example, the first PTL1 of the fourth pattern part PT2-1 as shown in FIG. 1A.

Referring to FIG. 5C, after the process of manufacturing the master stamp MS-2 for forming the second nano imprint pattern, a master stamp MS-3 including a third pattern part PT1-3 corresponding to the third pattern part PT1-3 of FIG. 1A may be formed in the third area PT1-3A through the same process as that of FIGS. 4A to 4H. The third pattern part PT1-3 may be spaced apart from the second pattern part PT1-2 by a predetermined distance, for example, the second length PTL2 of the fifth pattern part PT1-2 as shown in FIG. 1A. For convenience of the description, the process of forming the third pattern part PT1-3 may be referred to as a process of forming a third nano imprint pattern on the master stamp MS shown in FIGS. 1A and 2A.

The processes of manufacturing the master stamp MS for forming the first to third nano imprint patterns thereon according to an embodiment of the inventive concept may including forming the nano patterns onto different areas of the master stamp by using the same mold stamp to reduce the manufacturing cost of the master stamp and reduce the processing time to manufacture the master stamp for nano imprinting.

FIGS. 6A to 6F are cross-sectional views illustrating a method for manufacturing a master stamp for nano imprinting according to an embodiment of the inventive concept.

The same reference numerals are used for the same components as those of FIGS. 1A to 4I, and duplicated descriptions will be omitted. FIGS. 6A to 6G illustrate a process of forming the fourth pattern part PT2-1 of the second pattern group PT2-1, PT2-2, and PT2-3 that is described with reference to FIG. 1A.

Figure 6A:
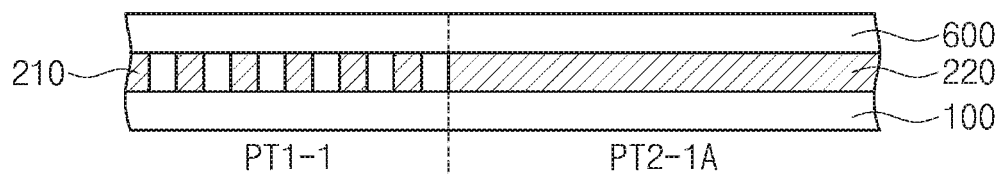
FIGS. 6A to 6G are cross-sectional views illustrating a method for manufacturing a master stamp for nano imprinting according to an embodiment of the inventive concept.
Figure 6A:
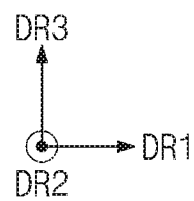

Referring to FIG. 6A, a preliminary second mask layer 600 is disposed on the first pattern part PT1-1 and the raw pattern layer 220 of FIG. 4H. The preliminary second mask layer 600 may include a metal. For example, the preliminary second mask layer 600 may include aluminum (Al), molybdenum (Mo), or the like.

Figure 6B:
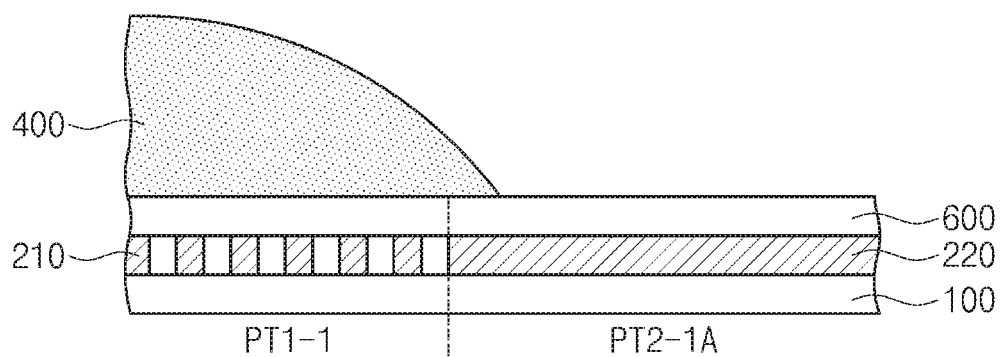
Figure 6B:
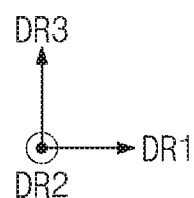
Figure 6C:
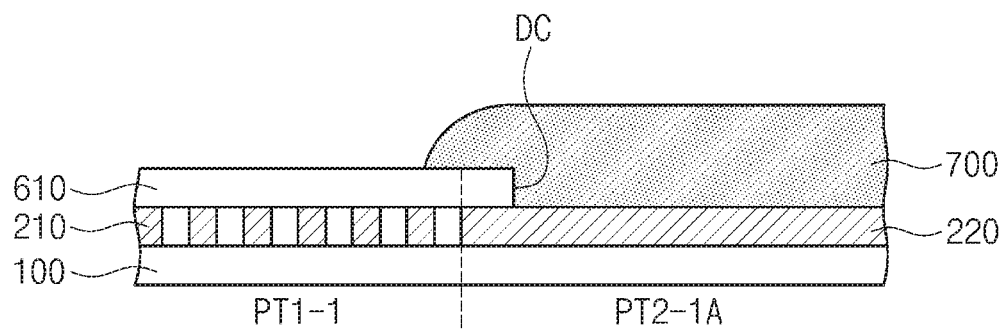
Figure 6C:
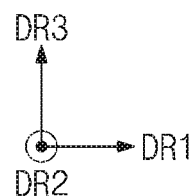

Thereafter, referring to FIGS. 6B and 6C, a photoresist pattern 400 may be applied to an area overlapping the first pattern part PT1-1 on the plane. The photoresist pattern 400 may be applied to cover a portion of the second area PT2-1A adjacent to the first area PT1-1A.

The photoresist pattern 400 may be used as a mask layer for etching the preliminary second mask layer 600. The preliminary second mask layer 600 is patterned to form a second mask pattern 610 using the photoresist pattern 400. The second mask pattern 610 may be formed to cover the first pattern part PT1-1, and the second mask pattern 610 may cover a portion of the raw pattern layer 220 in the second area PT2-1A that is adjacent to the first area PT1-1A.

Referring to FIG. 6C, the photoresist pattern 400 is removed, and a second resin layer 700 is applied to the substrate 100. The second resin layer 700 may be applied to cover an entire surface of the second area PT2-1A and a portion of the second mask pattern 610.

Figure 6D:
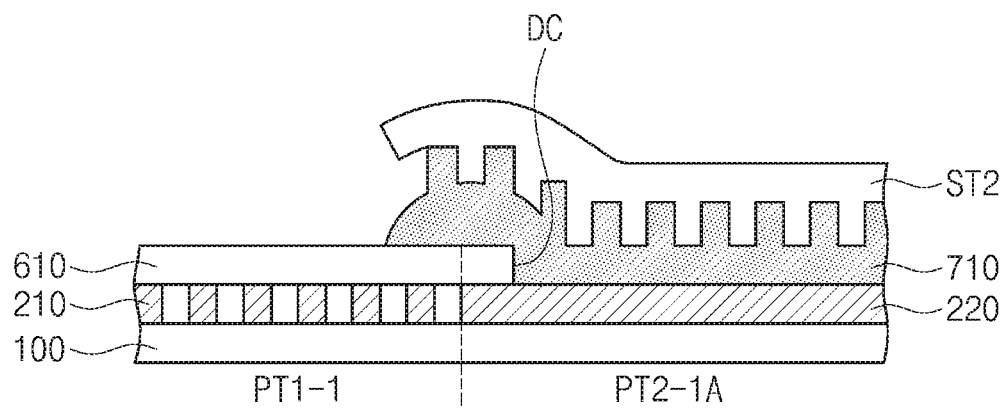
Figure 6D:
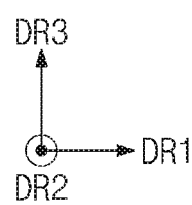
Figure 6E:
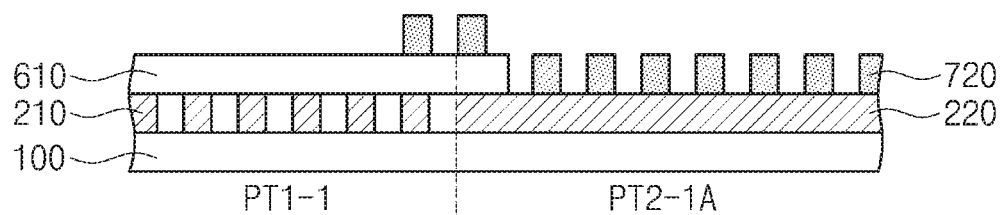
Figure 6E:
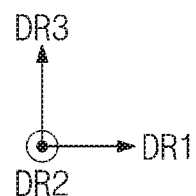

Thereafter, referring to FIGS. 6D and 6E, the second resin layer 700 may be pressed by a second mold stamp ST2 different from the first mold stamp ST1-1 and then cured to form a preliminary resin pattern 710. The second mold stamp ST2 may include the same pattern as that of the first mold stamp ST1-1 that is used to form the first nano imprint pattern as described in FIGS. 4A-4H. Thereafter, a residual layer may be removed from the preliminary resin pattern 710 to form a second resin pattern 720.

The second mask pattern 610 and the raw pattern layer 220 are disposed on layers different from each other. Thus, the preliminary resin pattern 710 may be formed to have a stepped portion DC on a boundary between the second mask pattern 610 and the raw pattern layer 220.

Figure 6F:
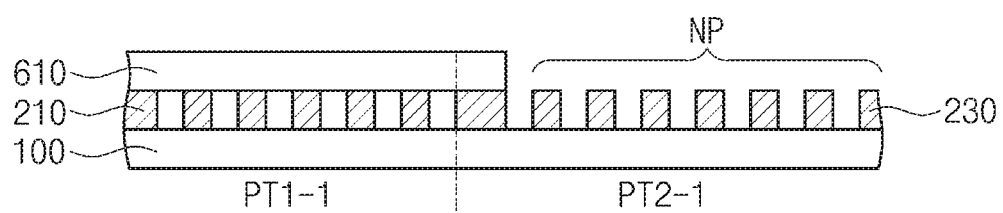
Figure 6F:
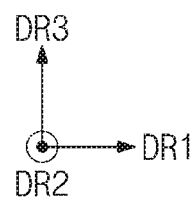
Figure 6G:
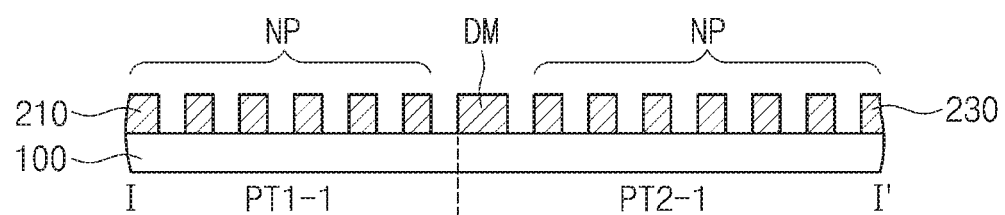
Figure 6G:
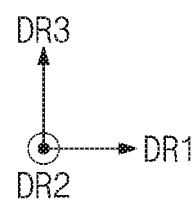

Thereafter, as illustrated in FIGS. 6F and 6G, the raw pattern layer 220 in the second area PT2-1A is patterned by using the second resin pattern 720 and the second mask pattern 610. For example, the raw pattern layer 220 is patterned by using the second resin pattern 720 and the second mask pattern 610 as etching barriers. Thus, a plurality of nano patterns NP having a nano pattern 230 may be formed in the second area PT2-1A as shown in FIG. 6F. Thereafter, the second mask pattern 610 may be reduced.

Referring to FIG. 6G, the fourth pattern part PT2-1 including the plurality of nano patterns NP may be formed in the second area PT2-1A. For convenience of the description, the process of forming the fourth pattern part PT2-1 according to the process of FIGS. 6A to 6G may be referred to as a process of forming a fourth nano imprint pattern on the master stamp MS shown in FIGS. 1A and 2A.

According to an embodiment of the inventive concept, a dummy pattern DM may be formed between the nano patterns NP of each of the first pattern part PT1-1 and the fourth pattern part PT2-1. The dummy pattern DM may correspond to a portion of the overlapping raw pattern layer 220 in the second area PT2-1A that is covered by the second mask pattern 610 and remain after etching the second mask pattern 610.

A length of the dummy pattern DM in the first direction DR1 may be greater than a length of a nano pattern of the nano patterns NP in the first direction DR1. The dummy pattern DM may be formed in the boundary between the first area PT1-1A and the second area PT2-1A while the nano patterns NP are formed by using different mold stamps (e.g., ST1-1 and ST2).

Although only the dummy pattern DM formed on a boundary between the first pattern part PT1-1 and the fourth pattern part PT2-1 is illustrated in FIG. 6G, the dummy pattern DM may be disposed on each of the boundaries between adjacent pattern parts. The dummy pattern DM may be disposed between the pattern parts formed at time intervals in an imprinting process of transferring the nano patterns NP. Thus, the pattern parts formed at different time intervals may be determined through the presence or absence of the dummy pattern DM.

Figure 7A:
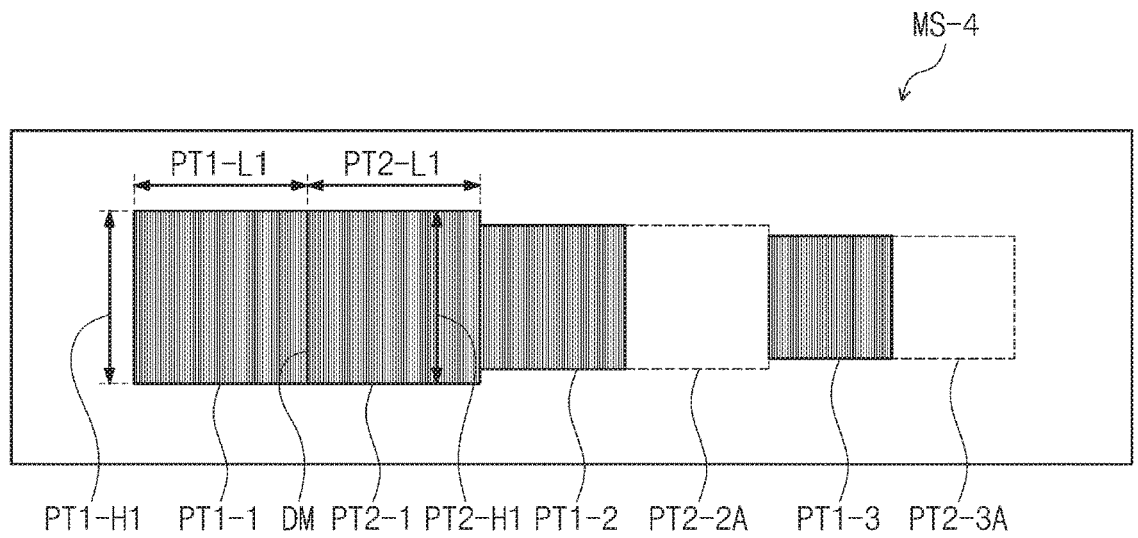
FIGS. 7A to 7C are plan views of a master stamp according to an embodiment of the inventive concept.
Figure 7A:
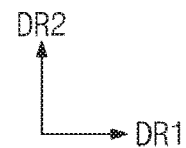
Figure 7B:
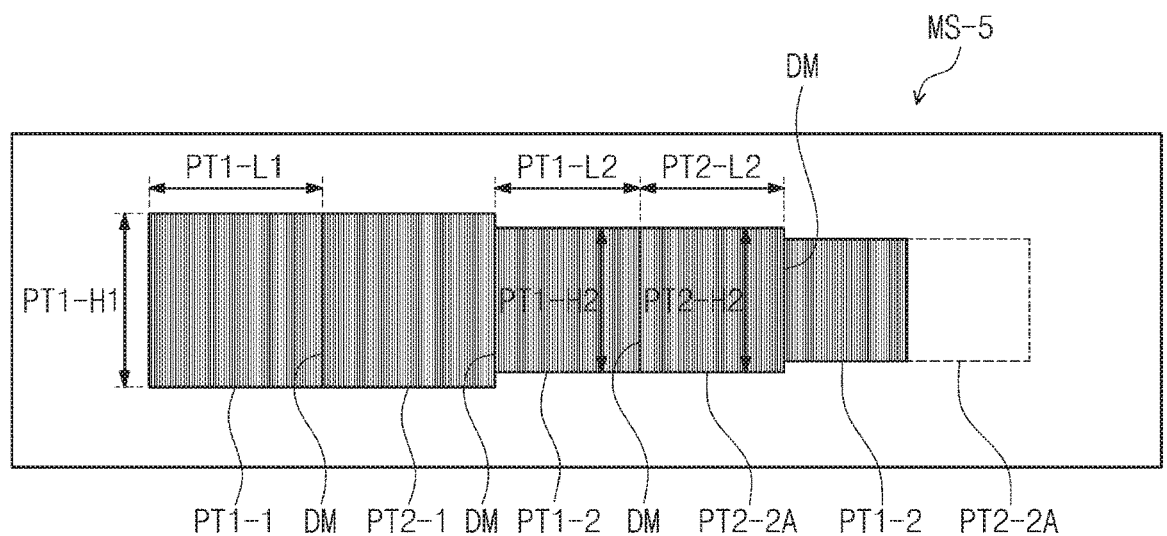
Figure 7B:
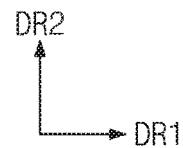
Figure 7C:
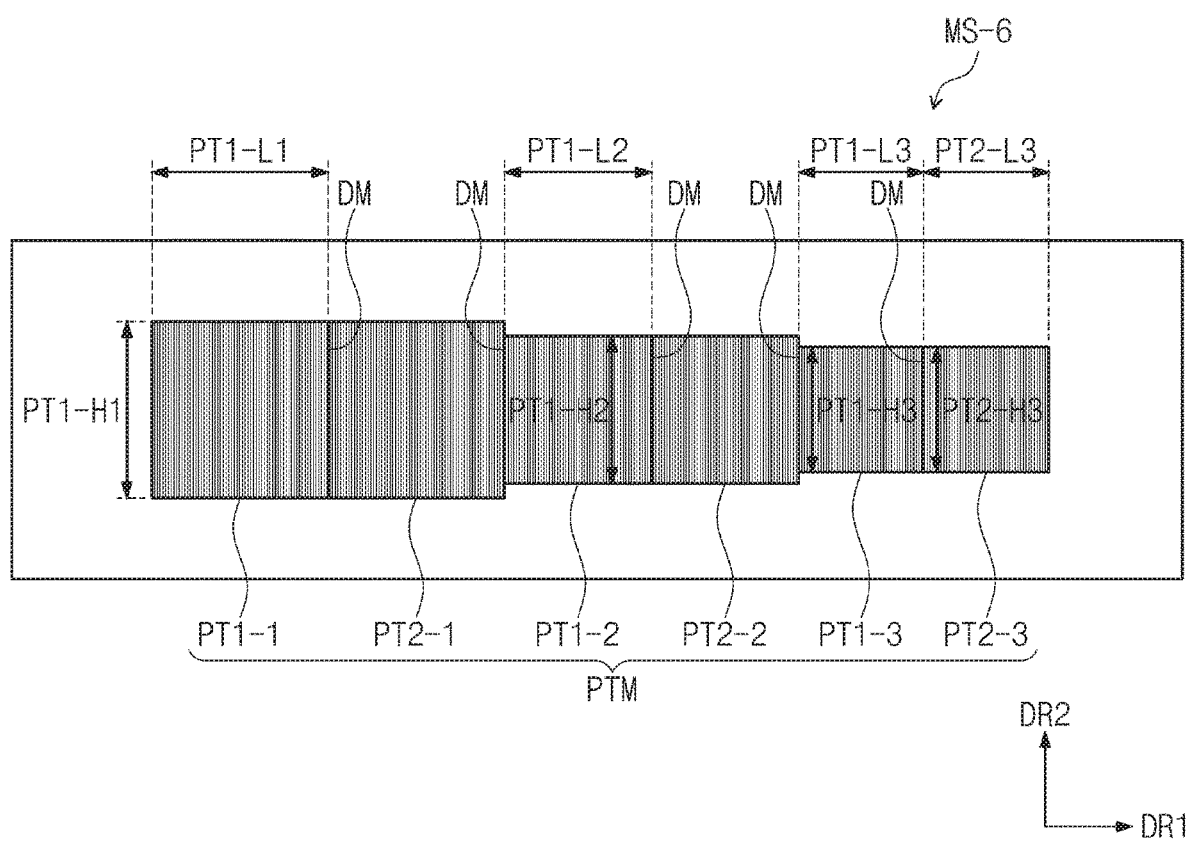

FIGS. 7A to 7C are plan views of a master stamp according to an embodiment of the inventive concept. Patterns of FIGS. 7A to 7C may be formed through the same imprinting processes as those described with reference to FIGS. 6A to 6G.

FIG. 7A illustrates a master stamp MS-4 including the fourth pattern part PT2-1 of the second pattern group PT2-1, PT2-2, and PT2-3 that is described with reference to FIG. 1A is formed on the master stamp MS-4 for nano imprinting. The fourth pattern part PT2-1 is disposed between the first pattern part PT1-1 and the second pattern part PT1-2.

A first width PT2-H1 of the fourth pattern part PT2-1 in the second direction DR2 may be the same as the first width PT1-H1 of the first pattern part PT1-1 in the second direction DR2. A first length PT2-L1 of the fourth pattern part PT2-1 in the first direction DR1 may be the same as the first length PT1-L1 of the first pattern part PT1-1 in the first direction DR1.

According to an embodiment of the inventive concept, the dummy pattern DM may be disposed between the first pattern part PT1-1 and the fourth pattern part PT2-1 and between the fourth pattern part PT2-1 and the second pattern part PT1-2.

FIG. 7B illustrates a master stamp MS-5 including the fifth pattern part PT2-2 of the second pattern group PT2-1, PT2-2, and PT2-3 that is described with reference to FIG. 1A is formed on the fifth master stamp MS-5 for nano imprinting. The fifth pattern part PT2-2 is disposed between the second pattern part PT1-2 and the third pattern part PT1-3. The fifth pattern part PT2-2 may be disposed to be spaced apart from the fourth pattern part PT2-1 in the first direction DR1.

A second width PT2-H2 of the fifth pattern part PT2-2 in the second direction DR2 may be the same as the second width PT1-H2 of the second pattern part PT1-2 in the second direction DR2. A second length PT2-L2 of the fifth pattern part PT2-2 in the first direction DR1 may be the same as the second length PT1-L2 of the second pattern part PT1-2 in the first direction DR1.

According to an embodiment of the inventive concept, the dummy pattern DM may be disposed between the second pattern part PT1-2 and the fifth pattern part PT2-2 and between the fifth pattern part PT2-2 and the third pattern part PT1-3.

The fifth pattern part PT2-5 may be formed by reusing the same mold stamp that is used to form the fourth pattern part PT2-1 in the same manner as that described with reference to FIGS. 3A to 3D. For convenience of the description, the process of forming the fifth pattern part PT2-2 may be referred to as a process of forming a fifth nano imprint pattern on the master stamp MS shown in FIGS. 1A and 2A.

FIG. 7C illustrates a master stamp MS-6 including the sixth pattern part PT2-3 of the second pattern group PT2-1, PT2-2, and PT2-3 that is described with reference to FIG. 1A is formed on the sixth master stamp MS-6 for nano imprinting. The sixth pattern part PT2-3 is disposed to be spaced apart from the fifth pattern part PT2-2 with the third pattern part PT1-3 disposed therebetween.

A third width PT2-H3 and a third length PT2-L3 of the sixth pattern part PT2-3 may be the same as the third width PT1-H3 and the third length PT1-L3 of the third pattern part PT1-3, respectively.

According to an embodiment of the inventive concept, a dummy pattern DM may be formed between the third pattern part PT1-3 and the sixth pattern part PT2-3.

The sixth pattern part PT2-3 may be formed by reusing the same mold stamp that is used to form the fourth pattern part PT2-1 and the fifth pattern part PT2-3. For convenience of the description, the process of forming the sixth pattern part PT2-3 may be referred to as a process of forming a sixth nano imprint pattern on the master stamp MS shown in FIGS. 1A and 2A.

According to an embodiment of the inventive concept, the processes of manufacturing the master stamp MS for forming the fourth to sixth nano imprint patterns thereon according to an embodiment of the inventive concept may include forming the nano patterns onto different areas of the master stamp by using the same mold stamp to reduce the manufacturing cost of the master stamp and reduce the processing time to manufacture the master stamp for nano imprinting. In addition, the nano patterns having the same length and width are formed adjacent to each other may prevent misalignment between the patterns.

Figure 8:
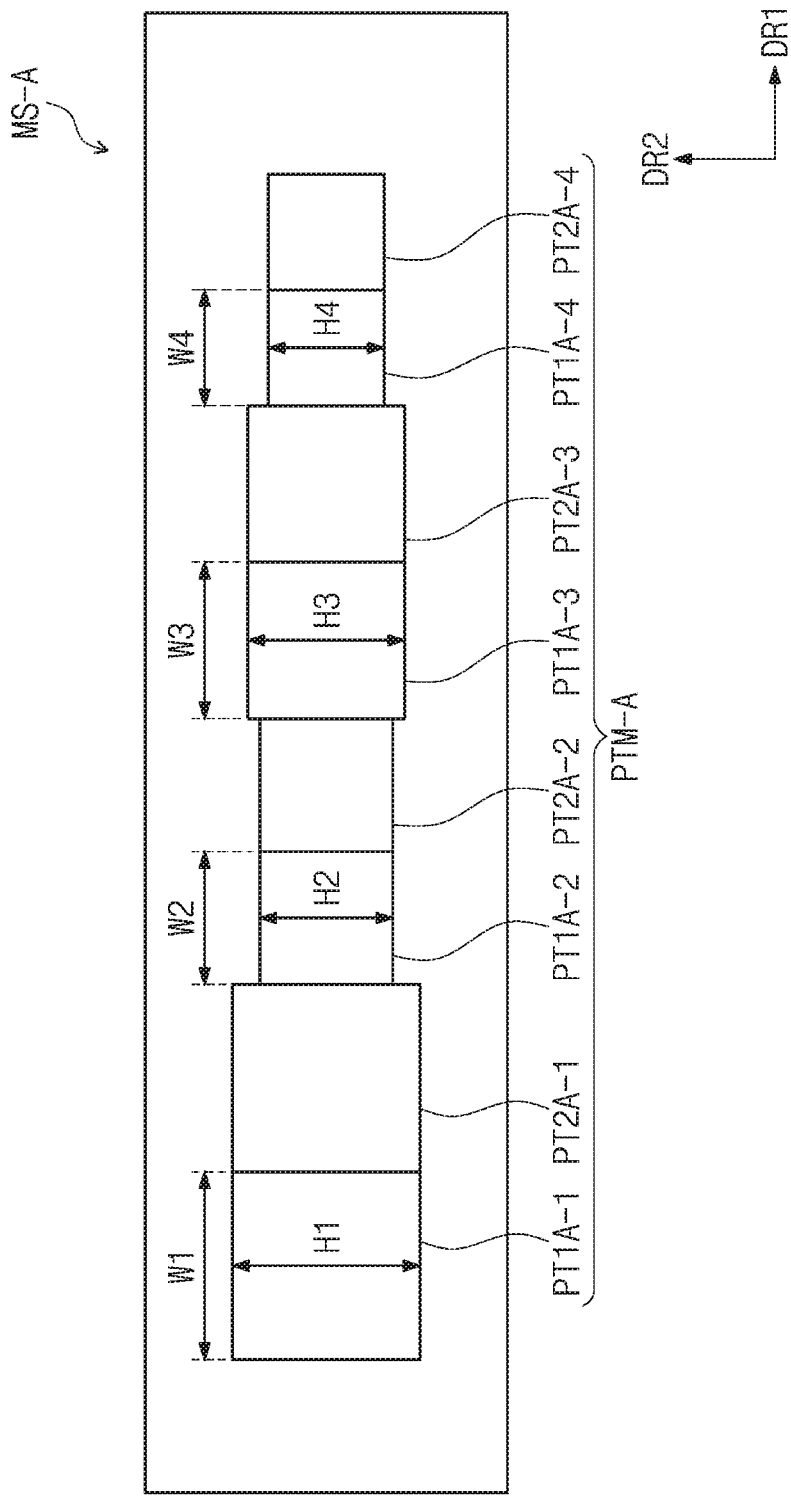
FIG. 8 is a plan view of a master stamp for nano imprinting according to another embodiment of the inventive concept.
Figure 9:
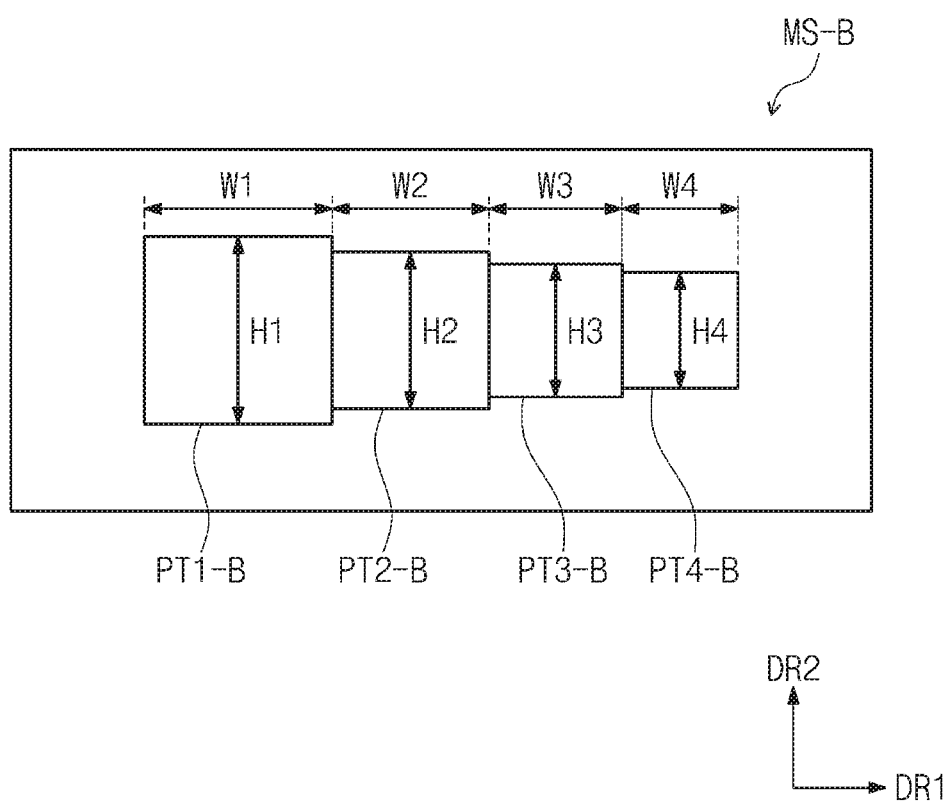
FIG. 9 is a plan view of a master stamp for nano imprinting according to another embodiment of the inventive concept.

FIG. 8 is a plan view of a master stamp for nano imprinting according to an embodiment of the inventive concept. FIG. 9 is a plan view of a master stamp for nano imprinting according to another embodiment of the inventive concept. The same reference numerals are used for the same components as those of FIGS. 1A to 7C, and duplicated descriptions will be omitted.

Referring to FIG. 8, unlike FIG. 1A, a master stamp MS-A may include a pattern group PTM-A including pattern parts arranged in the first direction DR1 having non-uniformly varying length and width. For example, the pattern group PTM-A includes a first pattern group PT1A-1, PT1A-2, PT1A-3, and PT1A-4 and a second pattern group PT2A-1, PT2A-2, PT2A-3, and PT2A-4.

The first pattern group PT1A-1, PT1A-2, PT1A-3, and PT1A-4 include a first pattern part PT1A-1, a second pattern part PT1A-2, a third pattern part PT1A-3, and a fourth pattern part PT1A-4. The first pattern part PT1A-1, the second pattern part PT1A-2, the third pattern part PT1A-3, and the fourth pattern part PT1A-4 may be disposed to be spaced apart from each other in the first direction DR1.

A first length W1 of the first pattern part PT1A-1 in the first direction DR1 and a first width H1 of the first pattern part PT1A-1 in the second direction DR2 may be the largest among the other pattern parts in the first pattern group except for the first pattern part PT1A-1.

The second pattern part PT1A-2 is disposed between the first pattern part PT1A-1 and the third pattern part PT1A-3. A second length W2 and a second width H2 of the second pattern part PT1A-2 may be smaller than a third length W3 and a third width H3 of the third pattern part PT1A-3.

The third pattern part PT1A-3 is disposed between the second pattern part PT1A-2 and the fourth pattern part PT1A-4. The third length W3 and the third width H3 of the third pattern part PT1A-3 may be greater than a length and width of each of the second and fourth pattern parts PT1A-2 and PT1A-4.

The fourth pattern part PT1A-4 is disposed to be spaced apart from the third pattern part PT1A-3 in the first direction DR1. The fourth pattern part PT1A-4 may have a fourth length W4 and a fourth width H4 that are smallest in the first pattern group.

The first to fourth pattern parts PT1A-1, PT1A-2, PT1A-3, and PT1A-4 of the master stamp MS-A according to the inventive concept may be formed through the same imprinting processes as those described with reference to FIGS. 2A to 5C. The nano patterns according to an embodiment of the inventive concept may be formed in the order of the first pattern part PT1-1, the third pattern part PT1-3, the second pattern part PT1-2, and the fourth pattern part PT1-4. However, the transferring of the nano patterns onto the master stamp MS-A is not limited to a specific embodiment as long as the nano patterns on the master stamp MS-A are transferred in the order from the pattern part having the largest length and width to the pattern part having the smallest length and width.

The second pattern group PT2A-1, PT2A-2, PT2A-3, and PT2A-4 include a fifth pattern part PT2A-1, a sixth pattern part PT2A-2, a seventh pattern part PT2A-3, and an eighth pattern part PT2A-4. The fifth pattern part PT2A-1, the sixth pattern part PT2A-2, the seventh pattern part PT2A-3, and the eighth pattern part PT2A-4 may be disposed to be spaced apart from each other in the first direction DR1.

The fifth pattern part PT2A-1 is disposed between the first pattern part PT1A-1 and the third pattern part PT1A-3. The sixth pattern part PT2A-2 is disposed between the second pattern part PT1A-2 and the third pattern part PT1A-3. The seventh pattern part PT2A-3 is disposed between the third pattern part PT1A-3 and the fourth pattern part PT1-4. The eighth pattern part PT2A-4 is disposed to be spaced apart from the seventh pattern part PT2A-3 with the fourth pattern part PT1A-4 disposed therebetween.

The fifth pattern part PT2A-1 and the first pattern part PT1A-1 may have the same first length W1 and the same first width H1. The sixth pattern part PT2A-2 and the second pattern part PT1A-2 may have the same second length W2 and the same second width H2. The seventh pattern part PT2A-3 and the third pattern part PT1A-3 may have the same third length W3 and the same third width W3. The eighth pattern part PT2A-4 and the fourth pattern part PT1A-4 may have the same fourth length W4 and the same fourth width H4. Although the second pattern group PT2A-1, PT2A-2, PT2A-3, and PT2A-4 may be formed by using a mold stamp that is different from the mold stamp used to form the first pattern group PT1A-1, PT1A-2, PT1A-3, and PT1A-4, the pattern parts having the same length and width may be disposed adjacent to each other to improve an alignment property of the master stamp MS-A.

Although the four pattern parts having sizes that gradually decrease in the order of the first pattern part PT1A-1, the third pattern part PT1A-3, the second pattern part PT1A-2, and the fourth pattern part PT1A-4 are illustrated in FIG. 8, the embodiment of the inventive concept is not limited thereto. For example, the number of pattern parts and the formation order of the pattern parts are not limited to a specific embodiment as long as the pattern parts having different areas are formed by using the same mold stamp in a decreasing order.

Referring to FIG. 9, unlike FIG. 8, a master stamp MS-B for nano imprinting includes a first pattern part PT1-B, a second pattern part PT2-B, a third pattern part PT3-B, and a fourth pattern part PT4-B.

The master stamp MS-B for nano imprinting according to an embodiment of the inventive concept may be formed by using only a single mold stamp. The master stamp MS-B for nano imprinting may be formed by using the same mold stamp, and the pattern parts having different lengths W1-W4 and widths H1-H4 may be formed in a decreasing order as being disposed adjacent to each other.

Figure 10:
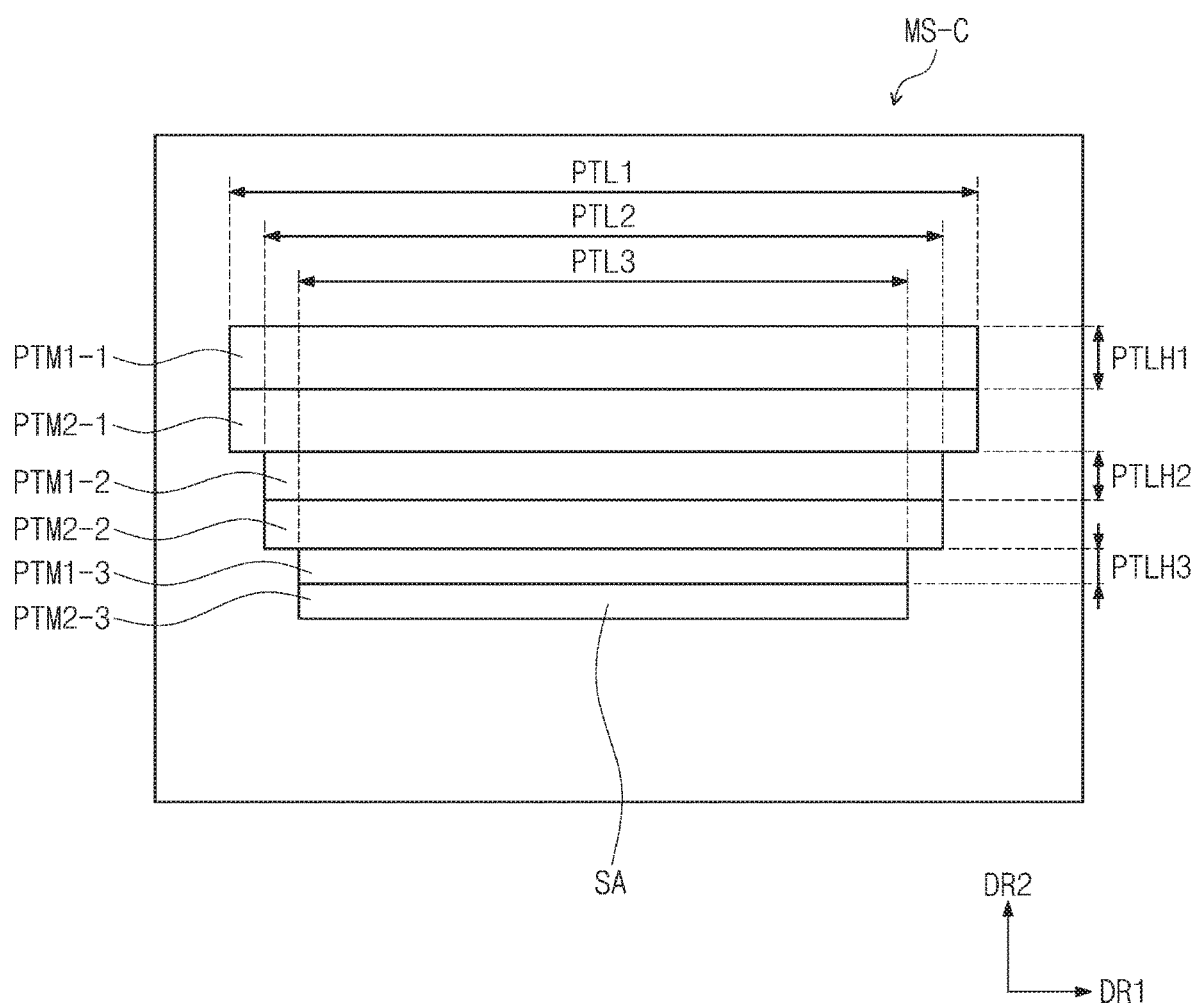
FIG. 10 is a plan view of a master stamp for nano imprinting according to another embodiment of the inventive concept.

FIG. 10 is a plan view of a master stamp for nano imprinting according to another embodiment of the inventive concept.

A master stamp MS-C for nano imprinting according to an embodiment of the inventive concept includes a first pattern group PTM1-1, PTM1-2, and PTM1-3 and a second pattern group PTM2-1, PTM2-2, and PTM2-3.

The first pattern group PTM1-1, PTM1-2, and PTM1-3 includes a first pattern part PTM1-1, a second pattern part PTM1-2, and a third pattern part PTM1-3. The first pattern part PTM1-1, the second pattern part PTM1-2, and the third pattern part PTM1-3 may be disposed to be spaced apart from each other in the second direction DR2.

For example, the first pattern part PTM1-1 may have a size corresponding to that of the transfer area SA of FIG. 2A. A first length PTL1 of the first pattern part PTM1-1 in the first direction DR1 and a first width PTLH1 of the first pattern part PTM1-1 in the second direction DR2 may be the largest among the pattern parts of the first pattern group.

The second pattern part PTM1-2 is disposed between the first pattern part PTM1-1 and the third pattern part PTM1-3. A second length PTL2 and a second width PTLH2 of the second pattern part PTM1-2 may be smaller than the first length PTL1 and the first width PTLH1 of the first pattern part PTM1-1.

The third pattern part PTM1-3 is disposed to be spaced apart from the second pattern part PTM1-2 in the second direction DR2. A third length PTL3 and a third width PTLH3 of the third pattern part PTM1-3 may be smaller than the second length PTL2 and the second width PTLH2 of the second pattern part PTM1-2.

The second pattern group PTM2-1, PTM2-2, and PTM2-3 includes a fourth pattern part PTM2-1, a fifth pattern part PTM2-2, and a sixth pattern part PTM2-3. The fourth pattern part PTM2-1, the fifth pattern part PTM2-2, and the sixth pattern part PTM2-3 may be disposed to be spaced apart from each other in the second direction DR2.

The fourth pattern part PTM2-1 is disposed between the first pattern part PTM1-1 and the second pattern part PTM1-2. The fourth pattern part PTM2-1 and the first pattern part PTM1-1 may have the same first length PTL1 and the same first width PTLH1. The fifth pattern part PTM2-2 is disposed between the second pattern part PTM1-2 and the third pattern part PTM1-3. The fifth pattern part PTM2-2 and the second pattern part PTM1-2 may have the same second length PTL2 and the same second width PTLH2. The sixth pattern part PTM2-3 is disposed to be spaced apart from the fifth pattern part PTM2-2 with the third pattern part PTM1-3 therebetween. The sixth pattern part PTM2-3 and the third pattern part PTM1-3 may have the same third length PTL3 and the same third width PTLH3.

In the master stamp MS-C according to an embodiment of the inventive concept, the first pattern part PTM1-1 corresponding to the transfer area SA may be formed through the nano imprinting process after the pattern group PTM of FIGS. 1A and 2A by performing the above-described first to sixth nano imprint processes. Thereafter, the nano imprinting process may be performed in the same order as the processes described with reference to FIGS. 2A to 7C to form the second pattern part PTM1-1, the third pattern part PTM1-3, the fourth pattern part PTM2-1, the fifth pattern part PTM2-2, and the sixth pattern part PTM2-3 onto the master stamp MS-C for nano imprinting.

According to an embodiment, the same mold stamp may be reused to manufacture the master stamp for nano imprinting, thereby reducing the manufacturing cost of the master stamp.

In addition, the same mold stamp may be used to form the nano patterns on the master stamp for nano imprinting, thereby preventing the misalignment between the patterns and improving the reliability.

It will be apparent to those skilled in the art that various modifications and variations can be made without deviating from the scope of the present disclosure. Thus, it is intended that the present disclosure covers various modifications and variations of the present disclosure provided they come within the scope of the present disclosure including appended claims and their equivalents.

What is claimed is:

1. A stamp for nano imprinting, the stamp comprising:
    a base substrate having a plane defined by a first direction and a second direction crossing each other;
    a first pattern group comprising a first pattern part and a second pattern part disposed on the base substrate, arranged to be spaced apart from each other in the first direction, and each has a rectangular shape defined along the first direction and the second direction; and
    a second pattern group comprising a third pattern part and a fourth pattern part disposed on the base substrate, arranged to be spaced apart from each other in the first direction, and each has a rectangular shape defined along the first direction and the second direction,
    wherein each of the first pattern part to the fourth pattern part comprises a plurality of nano patterns spaced apart along the first direction and each extending in the second direction,
    wherein the first pattern part, the third pattern part, the second pattern part, and the fourth pattern part are disposed to be arranged adjacent to each other in a linear sequential order in the first direction,
    wherein, in the second direction, a first length of the nano patterns of the first pattern part are different from a second length of the nano patterns of the second pattern part, and
    wherein, in the second direction, a third length of the nano patterns of the third pattern part are different from a fourth length of the nano patterns of the fourth pattern part.

2. The stamp of claim 1, wherein the second pattern part has a second width that is smaller than a first width of the first pattern part, and
    wherein the first length is longer than the second length, and the third length is longer than the fourth length.

3. The stamp of claim 2, wherein the third pattern part has the first width of the first pattern part, and
    wherein the fourth pattern part has the second width of the second pattern part, and
    wherein the first length and the third length are equal, and the second length and the fourth length are equal.

4. The stamp of claim 2, wherein the third pattern part has a third width that is smaller than the first width of the first pattern part and greater than the second width of the second pattern part, and
the fourth pattern part has a fourth width that is smaller than the second width of the second pattern part.

5. The stamp of claim 2, wherein the first pattern group further comprises a fifth pattern part, and the second pattern group further comprises a sixth pattern part,
    wherein the fifth pattern part and the sixth pattern part are arranged to be adjacent to each other on the base substrate and disposed to be spaced apart from the first pattern part to the fourth pattern part in the first direction,
    wherein a fifth width of the fifth pattern part in the first direction is smaller than the second width of the second pattern part in the first direction, and
    wherein a sixth width of the sixth pattern part has the fifth width of the fifth pattern part.

6. The stamp of claim 5, wherein the fifth pattern part is spaced apart from the second pattern part with the fourth pattern part disposed therebetween, and
    wherein the fifth pattern part and the sixth pattern part are arranged to be adjacent to each other in the sequential order in the first direction.

7. The stamp of claim 6, wherein a difference between the second width of the second pattern part and the fifth width of the fifth pattern part is same as a difference between the first width of the first pattern part and the second width of the second pattern part.

8. The stamp of claim 6, wherein the fifth pattern part and the sixth pattern part are disposed between the third pattern part and the second pattern part.

9. The stamp of claim 1, further comprising a plurality of dummy patterns respectively disposed between the first pattern part to the fourth pattern part,
    wherein each of the plurality of dummy patterns has a width that is greater than a width of a nano pattern of the plurality of nano patterns in the first direction.

10. The stamp of claim 1, wherein a difference in width of the first pattern and the second pattern is about 400 μm or more.

11. A stamp for nano imprinting, the stamp comprising:
    a base substrate having a plane defined in a first direction and a second direction crossing each other; and
    a pattern group comprising a plurality of nano patterns disposed on the base substrate and spaced apart from each other in the first direction and each extending in the second direction,
    wherein the pattern group comprises a first pattern group and a second pattern group, each of the first pattern group and the second pattern group comprises a first pattern part and a second pattern part that are arranged to be spaced apart from each other in the first direction and each has a rectangular shape defined along the first direction and the second direction,
    wherein the first pattern part of the first pattern group, the first pattern part of the second pattern group, the second pattern part of the first pattern group, and the second pattern part of the second pattern group are disposed to be arranged adjacent to each other in a linear sequential order in the first direction,
    wherein, in the second direction, a first length of the nano patterns of the first pattern part of the first pattern group are different from a second length of the nano patterns of the second pattern part of the first pattern group, and
    wherein, in the second direction, a third length of the nano patterns of the first pattern part of the second pattern group are different from a fourth length of the nano patterns of the second pattern part of the second pattern group.

12. The stamp of claim 11, wherein each of the first pattern part and the second pattern part of the first pattern group and the first pattern part and the second pattern part of the second pattern group has a width defined in the first direction, and
  wherein a first width of the first pattern part of the first pattern group is greater than a second width of the second pattern part of the first pattern group.

13. The stamp of claim 12, wherein the first pattern part of the second pattern group has the first width of the first pattern part of the first pattern group, and
  wherein the second pattern part of the second pattern group has the second width of the second pattern part of the first pattern group.

14. The stamp of claim 11, wherein the first pattern part and the second pattern part of the first pattern group and the first pattern part and the second pattern part of the second pattern group have widths that gradually decrease in the sequential order in the first direction.

15. The stamp of claim 11, further comprising a dummy pattern disposed between the first pattern group and the second pattern group and between the first pattern part and the second pattern part in each of the first pattern group and the second pattern group,
  wherein the dummy pattern has a width that is greater than a width of a nano pattern of the plurality of nano patterns in the first direction.

16. The stamp of claim 11, wherein the first length is longer than the second length, and the third length is longer than the fourth length, and
  wherein the first length and the third length are equal, and the second length and the fourth length are equal.

* * * * *